US008164700B2

(12) United States Patent
Hatta et al.

(10) Patent No.: US 8,164,700 B2
(45) Date of Patent: Apr. 24, 2012

(54) THIN FILM TRANSISTOR ARRAY, METHOD FOR MANUFACTURING THE SAME AND ACTIVE MATRIX DISPLAY

(75) Inventors: Kaoru Hatta, Tokyo (JP); Toru Okubo, Tokyo (JP); Ryohei Matsubara, Tokyo (JP)

(73) Assignee: Toppan Printing Co., Ltd., Tokyo (JP)

( * ) Notice: Subject to any disclaimer, the term of this patent is extended or adjusted under 35 U.S.C. 154(b) by 702 days.

(21) Appl. No.: 12/079,354

(22) Filed: Mar. 25, 2008

(65) Prior Publication Data

US 2008/0239189 A1  Oct. 2, 2008

(30) Foreign Application Priority Data

Mar. 28, 2007  (JP) ................... 2007-084195

(51) Int. Cl.
*G02F 1/136* (2006.01)
*H01L 29/00* (2006.01)
(52) U.S. Cl. ................ 349/42; 349/43; 257/59; 257/72

(58) Field of Classification Search ............... 349/42, 349/43; 257/59, 72
See application file for complete search history.

(56) References Cited

U.S. PATENT DOCUMENTS

| 2004/0201048 A1* | 10/2004 | Seki et al. ............ 257/294 |
| 2007/0012920 A1* | 1/2007 | Choi et al. ............ 257/59 |
| 2007/0024766 A1* | 2/2007 | Song et al. ............ 349/42 |
| 2007/0058101 A1* | 3/2007 | Kawasaki et al. ...... 349/43 |

FOREIGN PATENT DOCUMENTS

JP    2006-165535    6/2006

OTHER PUBLICATIONS

Garnier, F. et al., "All-Polymer Field-Effect Transistor Relized by Printing Techniques", *Science*, Sep. 16, 1994, pp. 1684-1686.

* cited by examiner

*Primary Examiner* — Michael Caley
(74) *Attorney, Agent, or Firm* — Squire Sanders (US) LLP

(57) ABSTRACT

One embodiment of the present invention is a thin film transistor array including an insulating substrate, a plurality of thin film transistors and a sealing layer. The sealing layer is stripe-shaped and covers a plurality of the thin film transistors. The sealing layer is formed over the insulating substrate.

19 Claims, 26 Drawing Sheets

(a)

(b)

(c)

(a) conventional art (b) the present invention

THIN FILM TRANSISTOR ARRAY, METHOD FOR MANUFACTURING THE SAME AND ACTIVE MATRIX DISPLAY

CROSS REFERENCE TO RELATED APPLICATION

This application claims priority to Japanese application number 2007-084195, filed on Mar. 28, 2007, which is incorporated herein by references.

BACKGROUND OF THE INVENTION

1. Field of the Invention

The present invention is related to a thin film transistor array, a method for manufacturing the thin film transistor array and an active matrix display.

In addition, the present invention is related to a thin film transistor array, a method for manufacturing the thin film transistor array and an active matrix display, the transistor being able to be used for a driving device of various image display devices, a logic device of various logic circuits or the like.

2. Description of the Related Art

According to a remarkable development of the information technology, now, information is frequently sent or received using a mobile information terminal, a notebook computer and the like. It is well-known that, in near future, the ubiquitous society will be realized so that information is sent or received at any place. In such a society, a thinner and lighter information terminal is desired.

Now, main stream of the semiconductor material is silicon type (Si type). However, the research and development of the transistor using an organic semiconductor (the organic transistor) have become active in views of improving the flexibility, reducing the weight and reducing the cost. In the case of the organic semiconductor, process in wet state can be generally adopted. Therefore, there are some advantages of the organic semiconductor. For example, increasing the size is possible, a printing method can be adopted and a plastic substrate can be used. (See non-patent document 1.)

In addition, the application field of the organic semiconductor is wide, and is not limited to the above-mentioned thin, light and flexible display. The application of the organic semiconductor to RFID (radio frequency identification) tag or a sensor is expected. In this way, for the ubiquitous society, the research and development of the organic transistor is necessary.

From these reasons, now, the research and development of the organic semiconductor using a printing method gather attention.

On the other hand, an amorphous oxide semiconductor $InGaZnO_4$ was published in Patent Document 1. $InGaZnO_4$ can be formed at a room temperature, and electric field mobility of $InGaZnO_4$ is more than amorphous silicon. $InGaZnO_4$ may be used as an oxide semiconductor. It is expected that $InGaZnO_4$ is a material for a high performance flexible transistor.

In addition, it is necessary for a sealing layer to be formed over a semiconductor since the characteristics of the semiconductor deteriorates due to oxygen or water entering the semiconductor.

Especially, characteristics of an organic semiconductor tend easily to change due to oxygen or water compared with an inorganic material. Therefore, a role of a sealing layer is important.

In addition, in the case where a semiconductor of an oxide is used, a role of a sealing layer is important in order to improve the characteristics.

An inorganic insulating layer, for example, silicon oxide and silicon nitride, is used for a sealing layer of an electric field effect type thin film transistor using a semiconductor having a main component of the above-mentioned oxide.

Further, patterning of the above-mentioned sealing layer is performed by a liftoff method or an etching method by which microfabrication is generally possible.

However, in the case of a thin film transistor array, if a sealing layer is formed as a dot-shaped pattern on respective thin film transistors, alignment accuracy is poor. Therefore, the transistor is easily influenced by oxygen etc. Thereby, there are problems in that characteristics degradations easily occur. For example, mobility of a semiconductor becomes small and ON/OFF ratio becomes small.

In addition, when a dot-shaped sealing layer is formed, there are the following problems: when a thin film transistor array is two-dimensionally observed from an upper part, misalignment of respective dots in both directions of X-axis and Y-axis occurs; thereby, it is difficult to keep alignment accuracy; and yield is low.

In addition, in the case where patterning of a sealing layer is performed by a liftoff method so that a sealing layer pattern comprised of an isolated pattern of a small dot is formed, a resist is applied the entire part except for the isolated pattern of the small dot. Therefore, there is problem in which the resist is difficult to be peeled off, thereby the processing time becomes long and the yield becomes small.

In addition, in the case where patterning is performed by an etching method, for example, a dry etching method using a fluorine system gas such as carbon tetrafluoride, a wet etching method using fluorinated acid are used. However, in the case of an isolated pattern of a small dot, etching characteristics are difficult to be controlled, thereby there is a problem in which the yield becomes small.

The present invention is made by considering these problems. One object of the present invention is to provide a thin film transistor array in which characteristics degradation is inhibited.

In addition, another object of the present invention is to provide a method for manufacturing a thin film transistor array in which a sealing layer can be formed while the alignment accuracy is good and the yield is high.

Further, another object of the present invention is to provide an active matrix display in which a high quality image display is possible by stabilizing characteristics of a semiconductor.

[Non-Patent Document 1] Science Vol. 265, 1684(1994)
[Patent Document 1] JP-A-2006-165532

SUMMARY OF THE INVENTION

The inventors studied to realize a thin film transistor array in which characteristic degradation of a semiconductor is inhibited. As a result, the inventors found that a thin film transistor array has the above-mentioned characteristics when the thin film transistor has a stripe-shaped sealing layer.

In addition, the inventors found that when a sealing layer is formed as a stripe-shaped pattern by a printing method, a sealing layer pattern can be easily formed. That is, the inventor found a method for manufacturing a thin film transistor array, the method having good alignment accuracy and a high yield.

In addition, the inventors found that when a sealing layer is formed as a stripe-shaped pattern by a liftoff method or an etching method, a sealing layer pattern can be easily formed. That is, the inventor found a method for manufacturing a thin film transistor array, the method having a high yield.

One embodiment of the present invention is a thin film transistor array including an insulating substrate, a plurality of thin film transistors and a sealing layer covering the thin film transistor, the sealing layer being stripe-shaped, covering a plurality of the thin film transistors and formed over the insulating substrate.

When a stripe shaped sealing layer is formed, alignment accuracy can be improved and a thin film transistor array in which characteristic degradation is inhibited can be obtained.

Another embodiment of the present invention is a thin film transistor array including
a thin film transistor including
an insulating substrate,
a gate electrode on the insulating substrate,
a gate insulating layer,
a source electrode and a drain electrode, the gate electrode overlapping the source electrode and the drain electrode through the gate insulating layer,
a semiconductor layer between the source electrode and the drain electrode,
a pixel electrode connected to the drain electrode,
and a capacitor electrode, the pixel electrode overlapping the capacitor electrode through the gate insulating layer, the thin film transistors arranged in a matrix-shaped and being with a plurality of gate wires connected to a plurality the gate electrodes and a plurality of source wires connected to a plurality of the source electrodes,
and a sealing layer formed over at least the semiconductor layer, the sealing layer being stripe-shaped over the insulating substrate and covering a plurality of the thin film transistors.

In this case, a thin film transistor array in which alignment accuracy is improved and characteristic degradation of a semiconductor is inhibited, can be provided.

Another embodiment of the present invention is the thin film transistor array wherein the sealing layer includes a fluorinated compound.

The inclusion of a fluorinated compound in a sealing layer prevents outside moisture or oxygen from entering a thin film transistor. Thereby, a thin film transistor array in which characteristic degradation of a semiconductor is inhibited can be provided.

Another embodiment of the present invention is the thin film transistor array wherein the sealing layer covers the source wire.

When a sealing layer covers a source wire, the influence of the source wire on displaying is inhibited. Especially, in the case where a bottom gate type has an upper pixel electrode, contact between the source wire and the upper pixel electrode can be prevented.

Another embodiment of the present invention is the thin film transistor array wherein an interlayer dielectric covers part of the gate wire and a capacitor wire connected to the capacitor electrode, and wherein an upper pixel electrode connected to the pixel electrode is formed over the interlayer dielectric.

When an interlayer dielectric covers a gate wire and a capacitor wire, the influence of these wires on displaying is inhibited. When an upper pixel electrode connected to a pixel electrode is formed, an effective display area can be made large.

Another embodiment of the present invention is the thin film transistor array wherein the interlayer dielectric is a dot-shaped type formed between the sealing layers or a stripe-shaped type perpendicular to the sealing layer, the stripe-shaped type covering a plurality of the thin film transistor.

When an interlayer dielectric is a dot-shaped type formed between sealing layers or a stripe-shaped type covering a plurality of thin film transistors which are arranged perpendicular to a sealing layer, throughput and alignment accuracy can be improved. Thereby, a thin film transistor array in which electrical connection between a pixel electrode and an upper pixel electrode can be easily realized, can be provided.

Another embodiment of the present invention is the thin film transistor array wherein the interlayer dielectric includes a fluorinated compound.

When an interlayer dielectric includes a fluorinated compound, outside moisture or oxygen can be prevented from entering a thin film transistor. In addition, especially in the case where a sealing layer include a fluorinated compound and an interlayer dielectric is a dot-shaped type, thicknesses of a sealing layer and an interlayer dielectric can be easily set to be identical. Thereby, in the case where an upper pixel electrode is formed, contact between upper pixel electrodes can be effectively inhibited. Further, if an interlayer dielectric includes a fluorinated compound, especially when an upper pixel electrode is formed by using an ink material, difference in affinity for a liquid between an interlayer dielectric and an upper electrode material can be made large. Thereby, in the case of forming of an upper pixel electrode, contact between upper pixel electrode materials can be inhibited.

Another embodiment of the present invention is a method for manufacturing the thin film transistor array including forming the sealing layer by a printing method.

In the case where a sealing layer is formed by a printing process, a method for manufacturing an inexpensive thin film transistor array in which a process is at low temperature and the number of processes is small can be provided.

Another embodiment of the present invention is the method for manufacturing the thin film transistor array wherein the printing method is a screen printing.

When a printing method is a screen printing method, a method for manufacturing a thin film transistor array can be provided in which an ink having various viscosities can be applied, an ink material can be selected from various materials, an efficiency in using an ink is high, and making a large area element is possible.

Another embodiment of the present invention is the method for manufacturing the thin film transistor array wherein the printing method is a flexo printing.

When a printing method is a flexo printing, a method for manufacturing a thin film transistor array can be provided in which making a large area element is possible.

Another embodiment of the present invention is the method for manufacturing the thin film transistor array wherein at least one process among a process of forming a gate electrode, a process of forming a source electrode and a drain electrode and a process of forming a pixel electrode is performed by a screen printing, a flexo printing or a reverse type offset printing.

When at least one of a gate electrode, a source electrode, a drain electrode and a pixel electrode is formed any one of a screen printing, a flexo printing and a reverse type offset printing, a method for manufacturing an inexpensive thin film transistor array can be provided in which a process is at a low temperature and the number of processes is small.

Another embodiment of the present invention is the method for manufacturing the thin film transistor array wherein an interlayer dielectric is formed by a printing method.

When an interlayer dielectric is formed by a printing method, a method for manufacturing an inexpensive thin film transistor array can be provided in which a process is at a low temperature and the number of processes is small.

Another embodiment of the present invention is the thin film transistor array wherein the sealing layer includes an inorganic insulating material.

When a sealing layer is comprised of an inorganic insulating material, outside moisture or oxygen is prevented from entering a thin film transistor. Thereby, a thin film transistor array can be provided in which characteristic degradation of a semiconductor is inhibited. Further, a semiconductor characteristic degradation can be inhibited which easily occurs in the case where an interlayer dielectric material such as an epoxy or an acryl is in contact with a semiconductor.

Another embodiment of the present invention is the thin film transistor array wherein the sealing layer includes silicon oxynitride.

When a sealing layer includes a silicon oxynitride, a film superior in an insulating property and a sealing performance can be obtained. Thereby, a thin film transistor array can be provided in which characteristic degradation of a semiconductor is inhibited.

Another embodiment of the present invention is the method for manufacturing the thin film transistor array wherein the sealing layer is formed by a liftoff method or an etching method.

When a sealing layer is formed by a liftoff method or an etching method, a high-definition pattern can be formed. Thereby, a high density thin film transistor array can be provided.

Another embodiment of the present invention is the thin film transistor array wherein the semiconductor layer includes an organic compound.

When a semiconductor layer includes an organic compound, layer formation at a low temperature is possible. Thereby, a thin film transistor array using a plastic substrate having a low resistance to heat can be obtained.

Another embodiment of the present invention is the thin film transistor array wherein the semiconductor layer includes an inorganic oxide.

When a semiconductor layer includes an inorganic oxide, layer formation at a low temperature is possible. Thereby, a thin film transistor array using a plastic substrate having a low resistance to heat can be obtained.

Another embodiment of the present invention is an active matrix display including the thin film transistor array and an image display medium.

In the case where an active matrix display include the thin film transistor array and an image display medium, since semiconductor characteristics is stabilized, an active matrix display in which a high quality image can be displayed can be obtained.

Another embodiment of the present invention is the active matrix display wherein the image display medium is an electrophoretic type.

When an image display medium is an electrophoretic type, an active matrix display having a high contrast and a wide viewing angle can be obtained.

Another embodiment of the present invention is the active matrix display wherein the image display medium is a liquid crystal type.

When an image display medium is a liquid crystal type, an active matrix display having a high quality display can be obtained in which semiconductor characteristics are improved.

Another embodiment of the present invention is the active matrix display wherein the image display medium is an organic electroluminescence type.

When an image display medium is an organic electroluminescence type, an active matrix display having a high contrast and a wide viewing angle can be obtained.

In these drawings, 1 is a substrate; 2 is a gate insulating film; 3 is a semiconductor layer; 4 is a sealing layer; 5 is an interlayer dielectric; 6 is an upper pixel electrode; 11 is a gate electrode; 12 is a gate wire; 13 is a capacitor electrode; 14 is a capacitor wire; 15 is a pixel electrode; 16 is a drain electrode; 17 is a source electrode; 18 is a source wire; 21 is a mesh; 22 is an emulsion; 23 is a printing plate; 24 is a squeegee; 25 is a paste ink; 26 is a substrate; 31 is an ink; 32 is an ink pan; 33 is an anilox roll; 34 is a doctor blade; 35 is a relief printing plate; 36 is a substrate; 37 is a connection part between a pixel electrode and an upper pixel electrode; 41 is a substrate; 42 is a gate insulating film (G11); 43 is an organic semiconductor (OSC1); 44 is a sealing (F1); 45 is an interlayer dielectric; 46 is an upper electrode; 51 is a gate electrode (G1); 53 is a capacitor electrode; 56 is a drain electrode (D1); 57 is a source electrode (S1); 62 is a gate insulating film (G12); 63 is an organic semiconductor (OSC2); 64 is a sealing (F2); 66 is a drain electrode (D2); 67 is a source electrode (S2); 71 is a hole transport layer; 72 is an organic light emitting layer; 73 is a common electrode; 101 is a substrate; 102 is a gate insulating film; 103 is a semiconductor layer; 104 is a sealing layer; 111 is a gate electrode; 112 is a gate wire; 113 is a capacitor electrode; 114 is a capacitor wire; 115 is a pixel electrode; 116 is a drain electrode; 117 is a source electrode; 118 is a source wire; 120 is a resist; and 121 is a remaining resist.

DETAILED DESCRIPTION OF THE INVENTION

Hereinafter, embodiments of the present invention are described in detail referring to figures. However, the present invention is not limited to these.

In an embodiment of the present invention, it is desirable that a sealing layer covering a thin film transistor be a stripe-shaped pattern covering a plurality of thin film transistors. In this type, characteristic degradation of a semiconductor is inhibited, while a thin film transistor array can be manufactured where alignment accuracy is good and yield is high.

Figure 1:
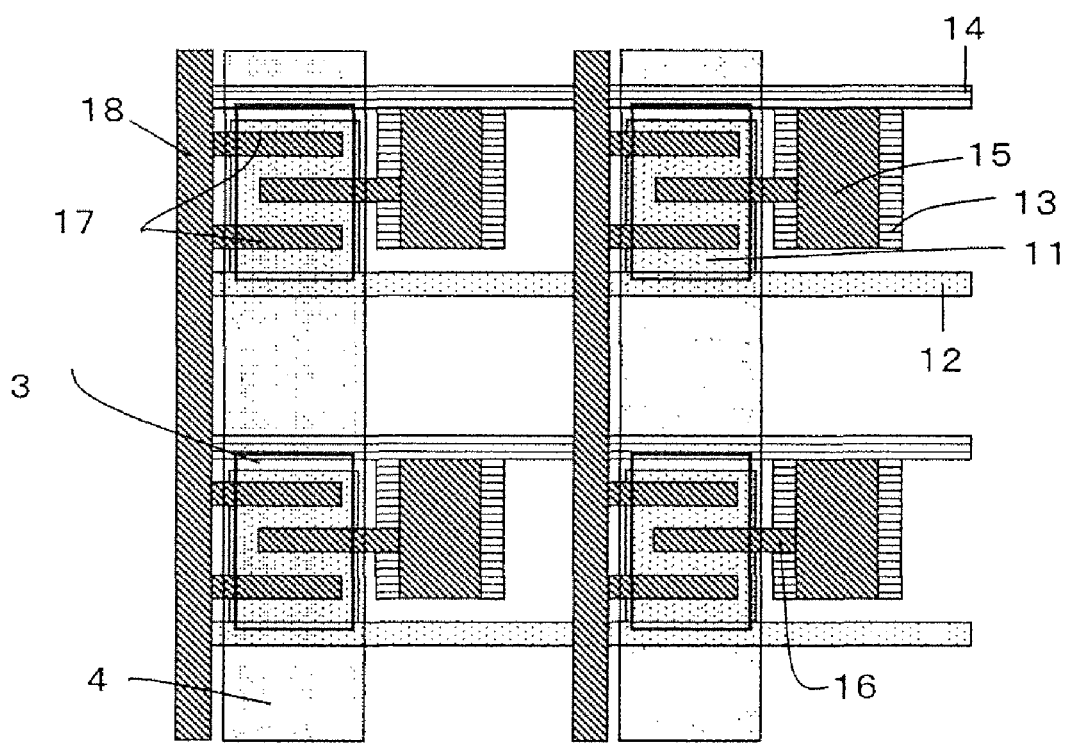
FIG. 1 is an exemplary diagram of a thin film transistor array (bottom gate/bottom contact type) of an embodiment of the present invention.
Figure 2:
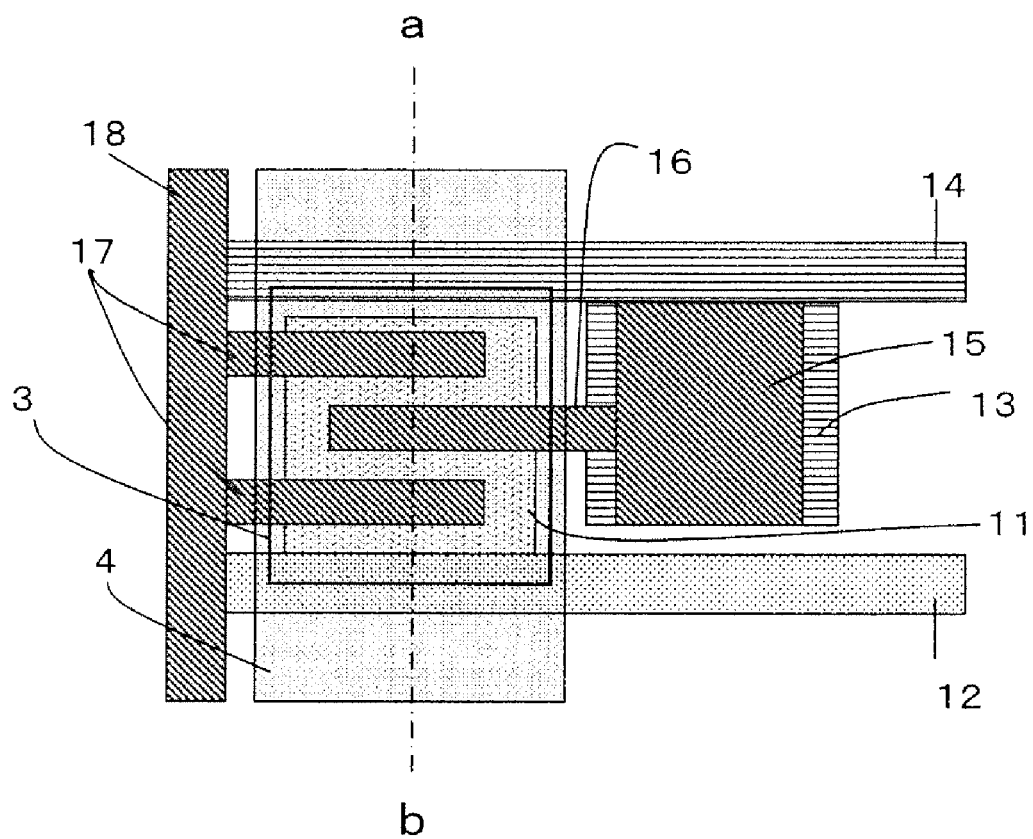
FIG. 2 is an enlarged view of one pixel in FIG. 1.
Figure 3:
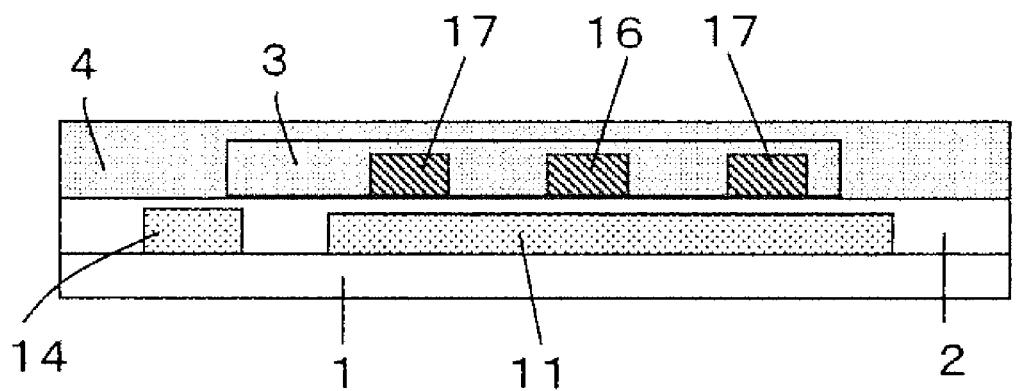
FIG. 3 is a cross-sectional view taken along the line a-b in FIG. 2.

FIGS. 1, 2 and 3 show examples of a thin film transistor array of the present invention. FIG. 2 is an enlarged view of one pixel in FIG. 1. FIG. 3 is a cross-sectional view taken along the line a-b in FIG. 2.

For example, a thin film transistor array of the present invention includes a thin film transistor arranged in matrix-shaped with a plurality of gate wire 12 connected to a plurality of gate electrode 11 and a plurality of source wire 18 connected to a plurality of source electrode 17, the thin film transistor including an insulating substrate 1, gate electrode 11 on the insulating substrate 1, the gate electrode 11 overlapping source electrode 17 and drain electrode 16 through gate insulating layer 2, semiconductor layer 3 at least between the source electrode and the drain electrode, drain electrode 16 connected to pixel electrode 15, pixel electrode 15 overlapping capacitor electrode 13 through gate insulating layer 2, and further the thin film transistor including a sealing layer 4 at least on semiconductor layer 3, the sealing layer 4 being stripe-shaped and covering a plurality of a thin film transistor In the case where a sealing layer 4 is a small dot-shaped pattern of an isolated pattern, a misalignment easily occurs, yield becomes low and degradation of a semiconductor layer easily occurs. However, in the case where a sealing layer 4 is a stripe-shaped pattern, a misalignment in printing is inhibited, alignment accuracy is improved and degradation of a semiconductor layer is inhibited.

A width of a stripe-shaped sealing layer 4 is not especially limited. However, it is desirable that the width be determined so that sealing layer 4 is not in contact with a pixel electrode 15. Further, any width is preferable if the sealing layer 4 covers at least a semiconductor layer 3. When a sealing layer is in contact with a pixel electrode, a problem occurs in which aperture ratio is reduced. In addition, when a sealing layer does not cover a semiconductor layer, the sealing layer can not prevent oxygen or water from entering a semiconductor layer.

In addition, a sealing layer 4 can cover a source wire 18 in order to prevent influence of the source wire 18 on displaying.

Further, when an upper pixel electrode is formed in the case of a bottom gate type, it is desirable that a source wire be especially covered in order to prevent influence of a short circuit on displaying, the short circuit occurring in the case where a source wire is in contact with an upper pixel electrode.

Any materials can be used for sealing layer 4 if the material can control oxygen or water entering a semiconductor layer. Examples of a material used for sealing layer 4 include polyimide, polyamide, polyester, poly vinylphenol, polyvinyl alcohol, epoxy resin, benzocyclobutene resin, phenol resin and acrylic resin.

When a sealing layer 4 includes a fluorinated compound, moisture or oxygen from outside can be prevented from entering a thin film transistor. Thereby, characteristic degradation of a semiconductor can be effectively and preferably inhibited. Especially, in the case where an organic compound is used for a semiconductor layer, characteristic degradation of the organic semiconductor does not preferably occur at the time of a sealing layer formation and after a sealing layer formation.

Examples of a fluorinated compound include fluorinated acrylic resin, condensed system fluorinated polymer such as fluorinated polyimide, fluorinated ether polymer, and fluorinated cyclic ether polymer. In addition, a perfluoro body in which all fluorinations are performed can be used. A perfluoro body in which chlorine etc. was substituted for a fluorination remainder can be used. Further, a perfluoro body can have a trifluoromethane substituent group etc.

The sealing layer can be preferably formed by a known method such as a relief printing method, a reverse type offset printing method, an ink-jet printing method, a screen printing method, a spray coat method or a spin coat method. However, it is desirable that the sealing layer be formed by a printing method in which a process is inexpensively performed at a low temperature and the number of processes is small.

When a sealing layer 4 is formed as an isolated pattern comprised of a small dot, misalignment caused by discharging defect or failure in transferring due to clogging of a printing plate occurs. The misalignment is in both directions of X-axis and Y-axis when a thin film transistor array is observed from an upper part. It becomes difficult to keep alignment accuracy and yield becomes low. Therefore, it is desirable that a stripe-shaped pattern be formed. When a stripe-shaped pattern is formed, misalignment occurs only in one direction. Thereby, a thin film transistor can be manufactured in which alignment accuracy is improved and yield is high. Especially, in the case where a thin film transistor of a large area is manufactured, a significant effect is achieved.

Examples of a printing method include a relief printing method, a reverse type offset printing method, an ink-jet printing method, a screen printing method and a flexo printing method. Especially, in the case of a screen printing, an ink having various viscosities can be applied, an ink material can be selected from various materials, efficiency in using an ink is high, and making a large area element is preferably possible. In addition, in the case of flexo printing, making a large area element is preferably possible.

Figure 4:
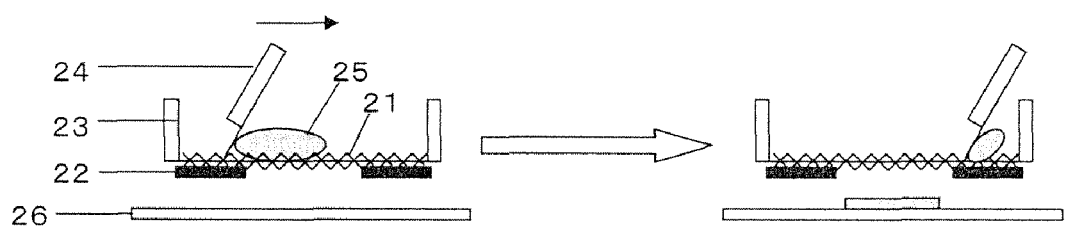
FIG. 4 is an exemplary diagram of a screen printing.
Figure 5:
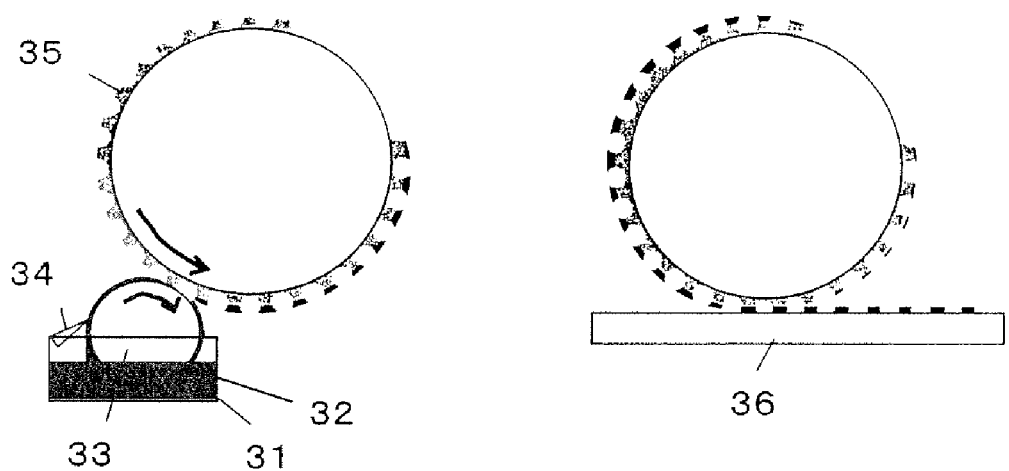
FIG. 5 is an exemplary diagram of a flexo printing.

FIG. 4 is a schematic diagram of a screen printing. FIG. 5 is a schematic diagram of a flexo printing.

For example, as shown in FIG. 4, a screen printing method is a method in which a printing plate 23 with a mesh 21 and a mask comprised of emulsion 22 is used, a squeegee 24 is moved, and printing is performed using a paste type ink 25 on a substrate 26.

For example, as shown FIG. 5, a flexo printing is as follows: lower part of an anilox roll 33 is dipped in an ink pan 32 filled with ink 31; while an anilox roll 33 is rotated, film thickness is controlled by a doctor blade; thereafter, an ink is supplied to a convex part of a relief printing plate 35; and an ink is transferred from this convex part to a substrate 36.

In an embodiment of the present invention, it is desirable that a flexible substrate be used for a substrate 1 having insulating properties. Examples of generally used material include plastic materials such as polyethylene terephthalate (PET), polyimide, polyethersulfone (PES), polyethylenenaphthalate (PEN) and polycarbonate. A glass substrate such as quartz, a silicon wafer and the like can be used for a substrate having insulating properties. However, a plastic substrate is preferable in view of making a device thin, light and flexible. It is desirable that PEN or polyimide be used for a substrate in view of temperatures of respective manufacturing processes. However, the usable substrates are not limited to these.

A material used for an electrode material is not especially limited. However, examples of generally used materials include a thin film of a metal or an oxide such as gold, platinum, nickel and indium tin oxide, a solution in which a metal conductive polymer such as poly (ethylenedioxythiophen)/polystyrene sulfonate (PEDOT/PSS) and polyaniline or a colloid particle such as gold, silver and nickel is dispersed, and a paste for forming a thick film using a metal particle such as a silver as a conductive material. In addition, a method for forming the electrode is not especially limited. The method may be a dry method such as evaporation coating or sputtering. However, in view of making the electrode flexible and inexpensive, it is desirable that the electrode be formed by wet methods such as a screen printing, a reverse type offset printing, a flexo printing and an ink jet method.

A material used for a gate insulating film 2 is not especially limited. However, examples of generally used materials include organic materials such as poly vinylphenol, polymethyl methacrylate, polyimide, polyvinyl alcohol and epoxy resin, and inorganic materials silicon oxide, silicon nitride, alumina and silicagel. In addition, a thin film such as PET, PEN or PES can be used for a gate insulating film 2. Application methods such as a spin coat method and a die coat method can be used for film formation of an organic material. In addition, a vacuum vapor deposition method, a sputtering method or the like can be used for film formation of an inorganic material.

A material used for a semiconductor is not especially limited. Examples of generally used materials include polymer system organic semiconductor materials such as polythiophene, polyallylamine, fluorene BT [2,2'-bithiophene] copolymer and the derivatives thereof, and low molecular system organic semiconductor materials such as pentacene, tetracene, copper phthalocyanine, perylene and the derivatives thereof. However, in view of making a device flexible and large-sized by low cost, it is desirable that an organic semiconductor material which can be applied to a printing method be used. In addition, carbon compounds such as carbon nano-tube and fullerene, and semiconductor nano particle dispersions can be also used as a semiconductor material. Well-known methods such as a gravure printing, an offset printing, a screen printing and an ink jet method can be used for a printing method for forming an organic semiconductor layer. In the case of the above-mentioned organic semiconductors, the solubility in a solvent is low. Therefore, it is desirable that a flexo printing, a reverse type offset printing, an ink jet method and a dispenser method, which are suitable for printing a low-viscosity solution, be used.

In addition, a known oxide semiconductor material such as zinc oxide, indium oxide, tin oxide, tungsten oxide and zinc oxide gallium indium which are oxides including one or more element among zinc, indium, tin, tungsten, magnesium and gallium can be used.

For film formation method of these oxide semiconductor layers, sputter method, pulsed laser deposition, vacuum evaporation deposition method, CVD (Chemical Vapor Deposition) method, MBE (Molecular Beam Epitaxy) method and sol-gel process can be used.

In an embodiment of the present invention, an image display medium of a display is not especially limited. However, an electrophoretic type, a liquid crystal type, an organic electroluminescence (EL) type and the like can be preferably used.

An electrophoretic type is as follows: charged particles dispersed in a liquid are moved inside the liquid in accordance with outside electric field; for example, positively charged particles and negatively charged particles dispersed in a liquid are sandwiched between two electrodes; when an electric field is applied, negatively charged fine particles go toward a positive electrode side and positively charged particles go toward a negative electrode side; thereby, an image is displayed.

A liquid crystal type is as follows: orientation of a liquid crystal molecule is controlled depending on whether a voltage is applied or not; and translucency in a liquid crystal layer is controlled.

An organic electroluminescence type is as follows: an organic electroluminescence layer including an organic light emitting material is formed between two electrodes; when an electric current from both electrodes flows through the organic electroluminescence layer, light is emitted and is taken out.

In the case where an electrophoretic type is used for an image display medium, a display having a high contrast and a wide viewing angle can be obtained.

In the case where a liquid crystal type is used for an image display medium, a high quality image display can be obtained in which characteristics of a semiconductor is improved.

In the case where an organic electroluminescence type is used for an image display medium, a display having a high contrast and a wide viewing angle can be obtained.

A structure of a transistor in an embodiment of the present invention is not especially limited. All structures such as a bottom gate/bottom contact type, a bottom gate/top contact type and a top gate/bottom contact type can be adopted.

In addition, an interlayer dielectric, an upper pixel electrode, a gas barrier layer, a planarizing layer or the like can be used for a thin film transistor array of the present invention, if necessary.

Here, if an interlayer dielectric covers at least part of a gate wire and a capacitor wire, the interlayer dielectric can be used. That is, part covered by other insulating layer such as a sealing layer may be covered by an interlayer dielectric or may not be covered by an interlayer dielectric. However, part which is not covered by an insulating layer should be covered by an interlayer dielectric.

Further, connection part between an upper pixel electrode and a pixel electrode can be preferably covered.

Figure 13:
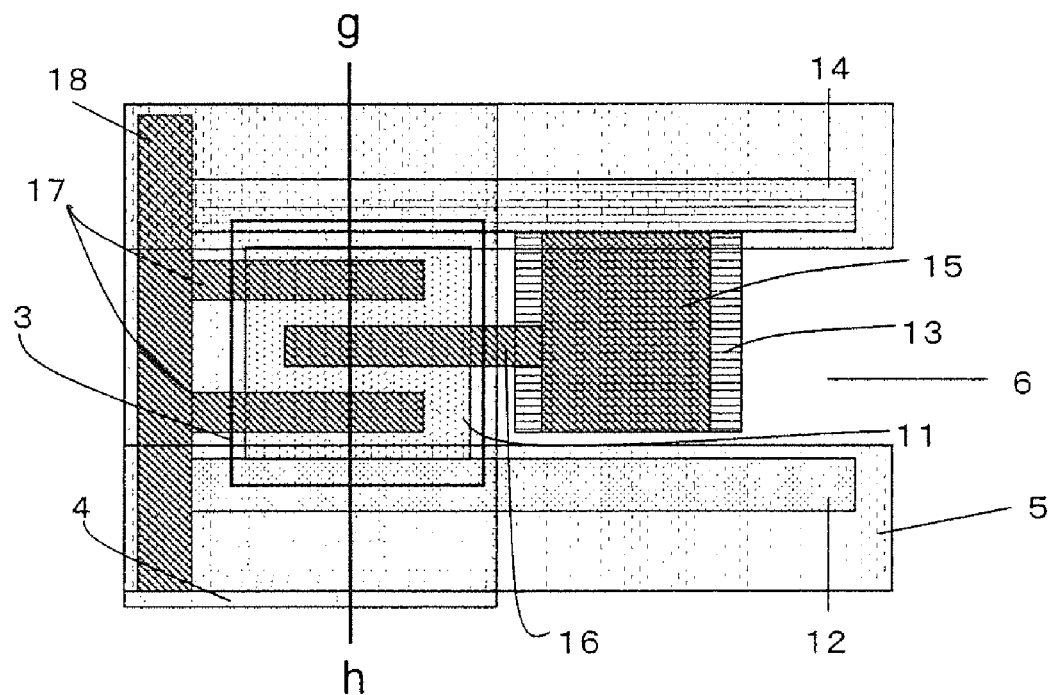
FIG. 13 is an enlarged view of one pixel in FIG. 12.

Interlayer dielectric 5 can be formed as a dot-shaped pattern between sealing layers 4 (FIG. 4) or as a stripe-shaped pattern covering a plurality of thin film transistors which are formed perpendicular to the sealing layer (FIG. 13).

When a dot-shaped type is adopted, an interlayer dielectric can be formed on part where a sealing layer is not formed. Thereby, film thicknesses of a sealing layer and an interlayer dielectric can be easily set to be identical. Therefore, in the case where an upper pixel electrode is formed, contact between upper pixel electrode materials can be inhibited. Thereby, an upper pixel electrode layer without a short circuit can be easily formed.

When a stripe-shaped type is adopted, a pattern can be easily formed. Thereby, an interlayer dielectric having good alignment accuracy and a high yield can be formed.

A material used for an interlayer dielectric is not especially limited if the material has an insulating property. Examples of the materials for the interlayer dielectric include polyimide, polyamide, polyester, poly vinylphenol, polyvinyl alcohol, epoxy resin, benzocyclobutene resin, phenol resin and acrylic resin.

If an interlayer dielectric includes a fluorinated compound, outside moisture or water can be preferable prevented from entering a thin film transistor. In addition, especially, in the case where a sealing layer is comprised of a fluorinated compound and an interlayer dielectric is a dot-shaped pattern, film thicknesses of a sealing layer and an interlayer dielectric can be easily set to be identical. Therefore, in the case where an upper pixel electrode is formed, contact between upper pixel electrode materials can be inhibited. Further, if an interlayer dielectric includes a fluorinated compound, especially when an upper pixel electrode is formed by using an ink material, difference in affinity for a liquid between an interlayer dielectric and an upper electrode material can be made large. Thereby, in the case of forming of an upper pixel electrode, contact between upper pixel electrode materials can be inhibited.

Examples of a fluorinated compound include fluorinated acrylic resin, condensed system fluorinated polymer such as fluorinated polyimide, fluorinated ether polymer, and fluorinated cyclic ether polymer. In addition, a perfluoro body in which all fluorinations are performed can be used. A perfluoro body in which chlorine etc. was substituted for a fluorination remainder can be used. Further, a perfluoro body can have a trifluoromethane substituent group etc.

The interlayer dielectric can be preferably formed by a known method such as a relief printing method, a reverse type offset printing method, an ink-jet printing method, a screen printing method, a spray coat method or a spin coat method. However, it is desirable that the interlayer dielectric be formed by a printing method in which a process is inexpensively performed at a low temperature and the number of processes is small.

Examples of a printing method include a relief printing method, a reverse type offset printing method, an ink-jet printing method, a screen printing method and a flexo printing method. Especially, in the case of a screen printing, an ink having various viscosities can be applied, an ink material can be selected from various materials, efficiency in using an ink is high, and making a large area element is preferably possible. In addition, in the case of flexo printing, making a large area element is preferably possible.

When an upper pixel electrode connected to a pixel electrode is formed on an interlayer dielectric, an effective display area can be made large.

Metals such as Al, Ag, Au, Ni, Ta and Cr can be used for a material of an upper pixel electrode. The upper pixel electrode can be formed by a printing method such as a screen printing method.

In addition, the name "source/drain" is conveniently used. That is, the name can be called reversely "drain/source". In the present invention, an electrode connected to a source wire is called a source electrode and an electrode connected to a pixel electrode is called a drain electrode.

Next, another embodiment of the present invention is described.

Figure 20:
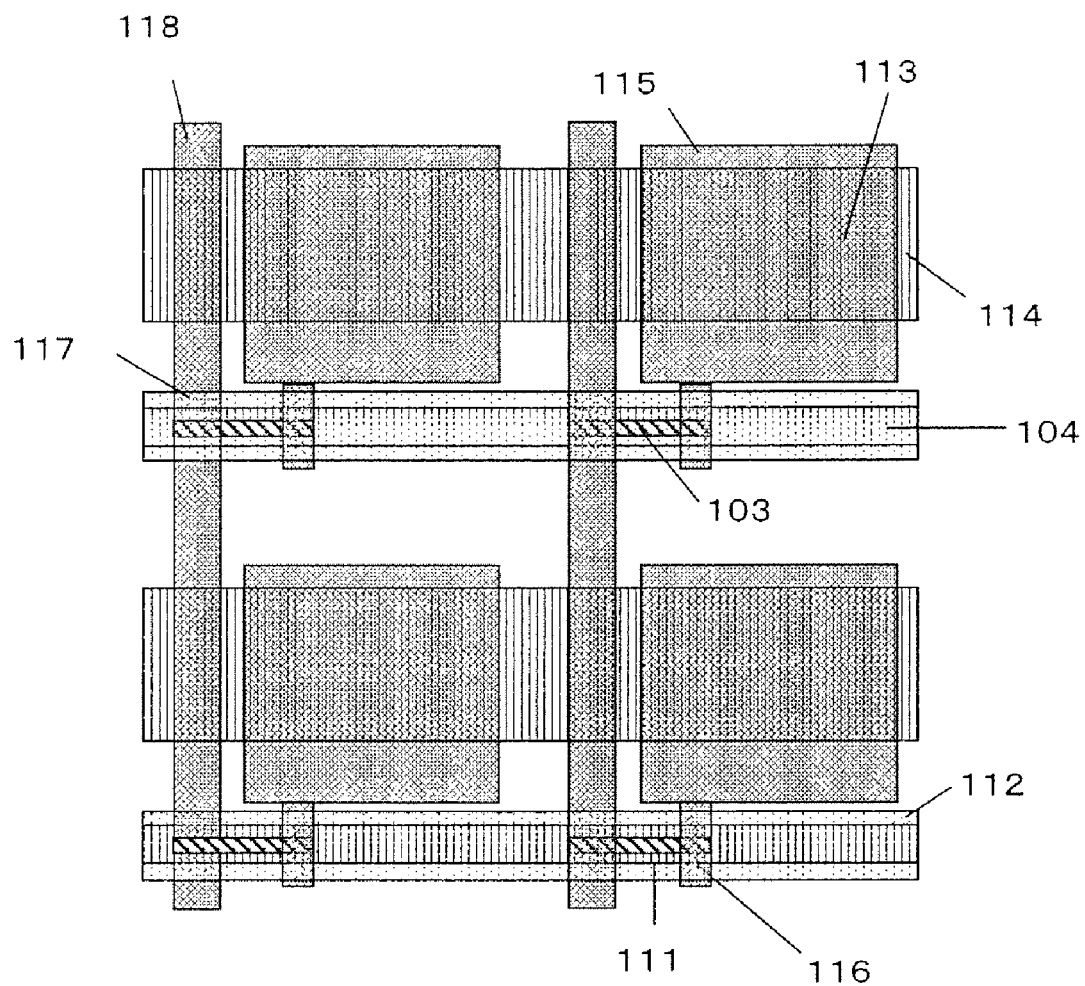
FIG. 20 is an exemplary diagram of a thin film transistor array (bottom gate/top contact type) of another embodiment of the present invention.
Figure 21:
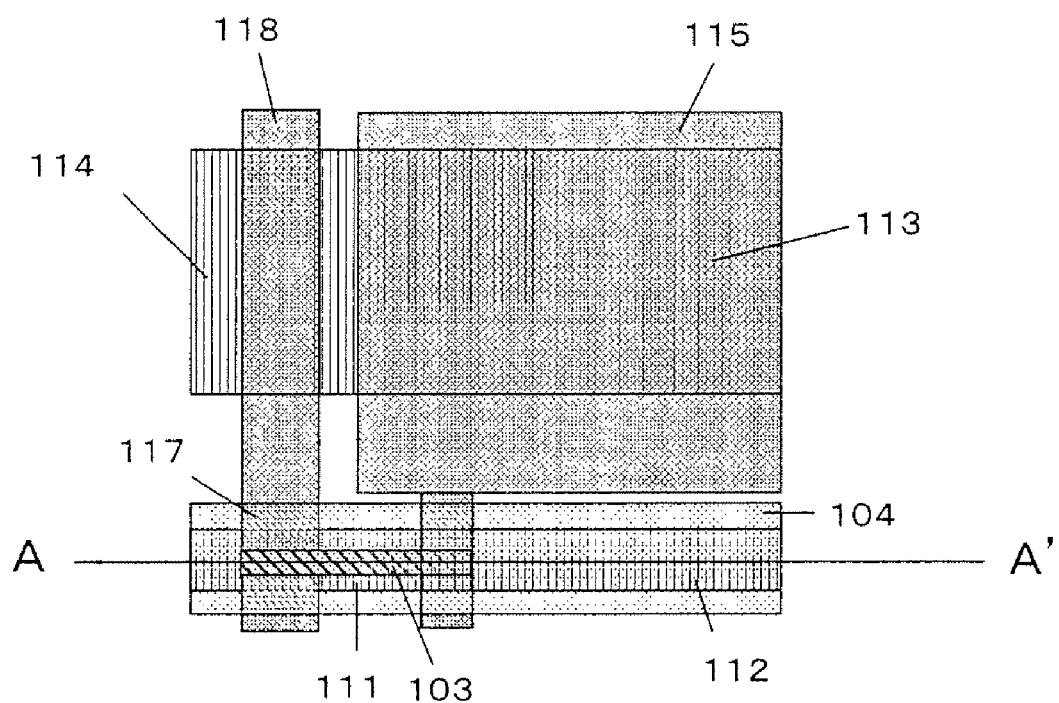
FIG. 21 is an enlarged view of one pixel in FIG. 20.
Figure 22:
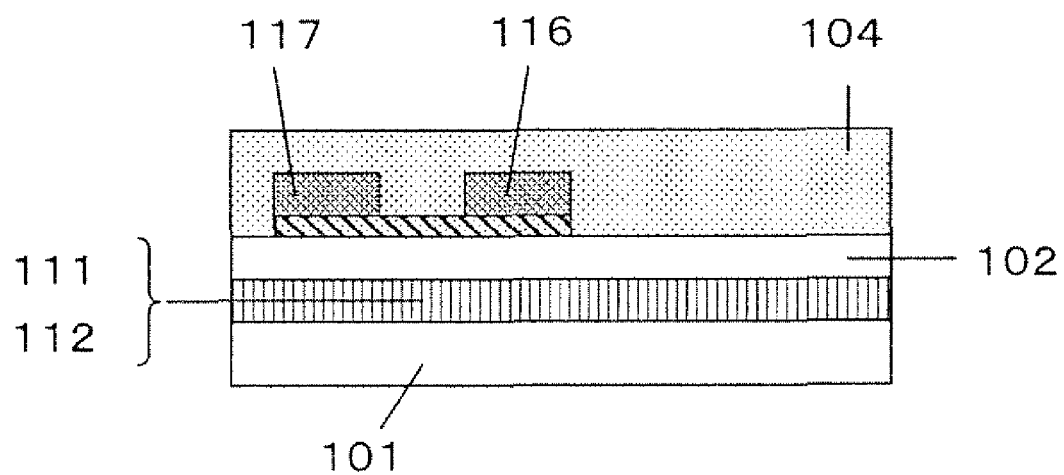
FIG. 22 is a cross-sectional view taken along the line A-A' in FIG. 21.
Figure 23:
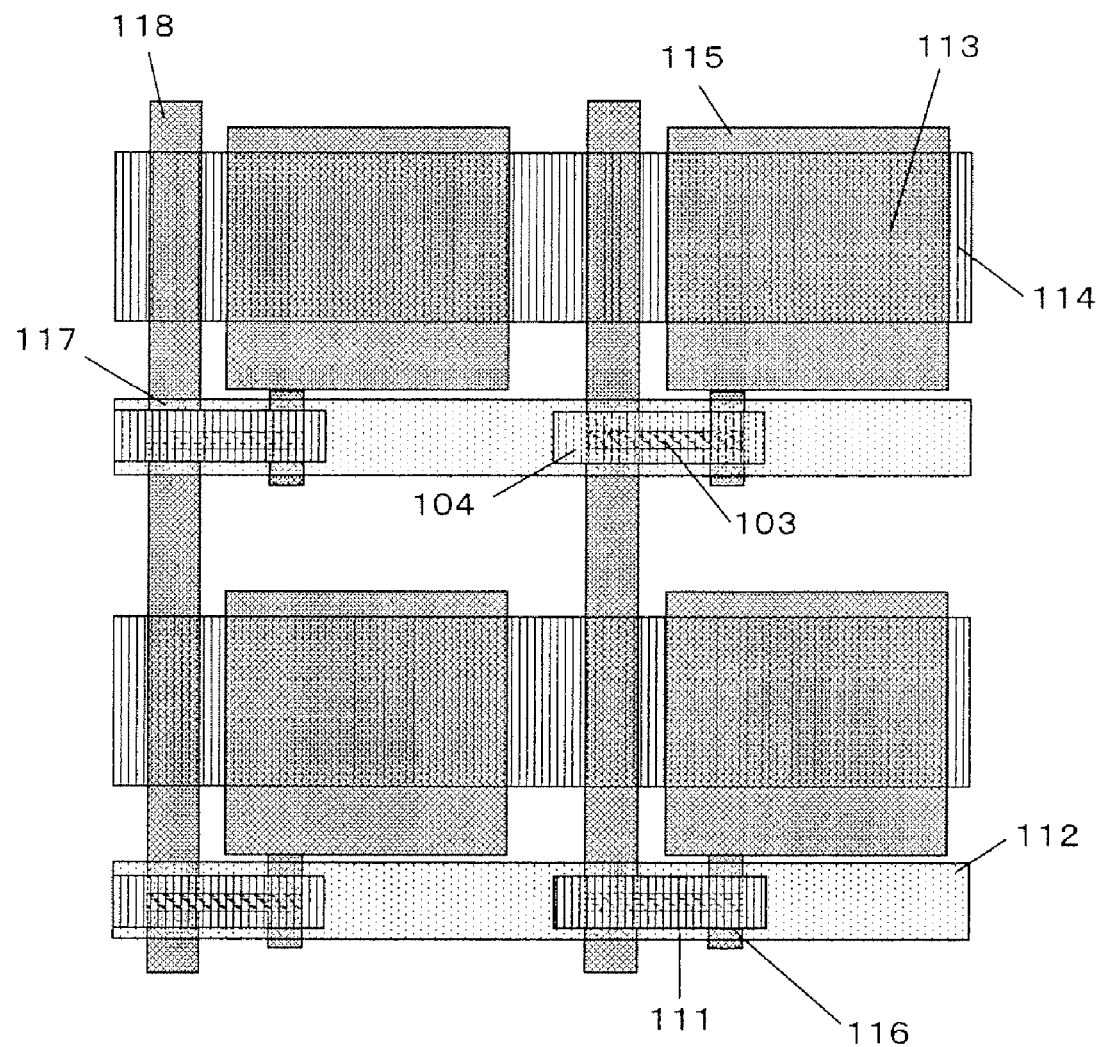
FIG. 23 is an exemplary diagram of a conventional thin film transistor.

FIGS. 20, 21 and 22 show an embodiment of the present invention.

FIG. 20 is a schematic diagram of a thin film transistor array (bottom gate/top contact type) showing an example of the present invention.

FIG. 21 is an enlarged view of one pixel in FIG. 20.

FIG. 22 is a cross-sectional diagram of FIG. 20.

A thin film transistor array of the present invention includes a thin film transistor,
    the thin film transistor including
        an insulating substrate 101,
        at least a gate electrode 111 on the insulating substrate 101, the gate electrode 111 overlapping a source electrode 117 and a drain electrode 116 through an gate insulating layer 102,
        a semiconductor layer 103 at least between a source electrode and a drain electrode,
        a sealing layer 104 at least on the semiconductor layer 103, the drain electrode 117 connected to a pixel electrode 115, the pixel electrode 115 overlapping a capacitor electrode 113 through the gate insulating layer 102,
    the thin film transistor arranged in a matrix-shaped with a gate wire 112 connected to a plurality of gate electrode 111 and a source wire 118 connected to a plurality of source electrode 117,
    the sealing layer being a stripe-shaped pattern and covering the adjacent thin film transistors.

Figure 24:
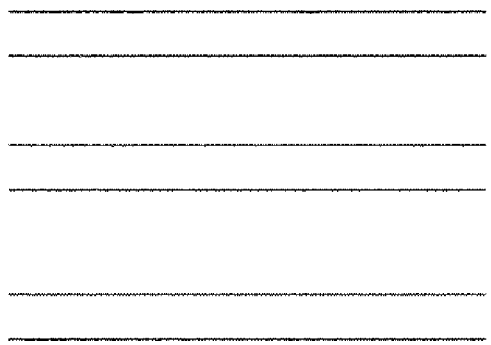
FIGS. 24(a), (b) and (c) are shapes of a pattern of a sealing layer in some embodiments of the present invention.
Figure 24:
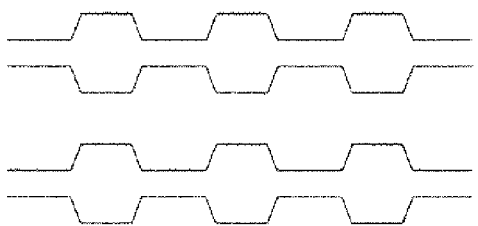
Figure 24:
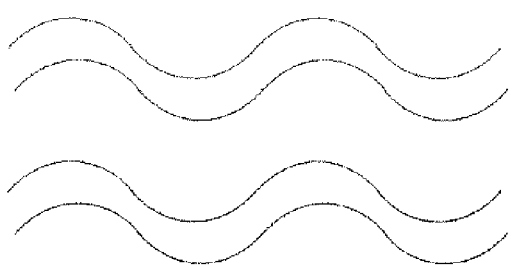
Figure 25:
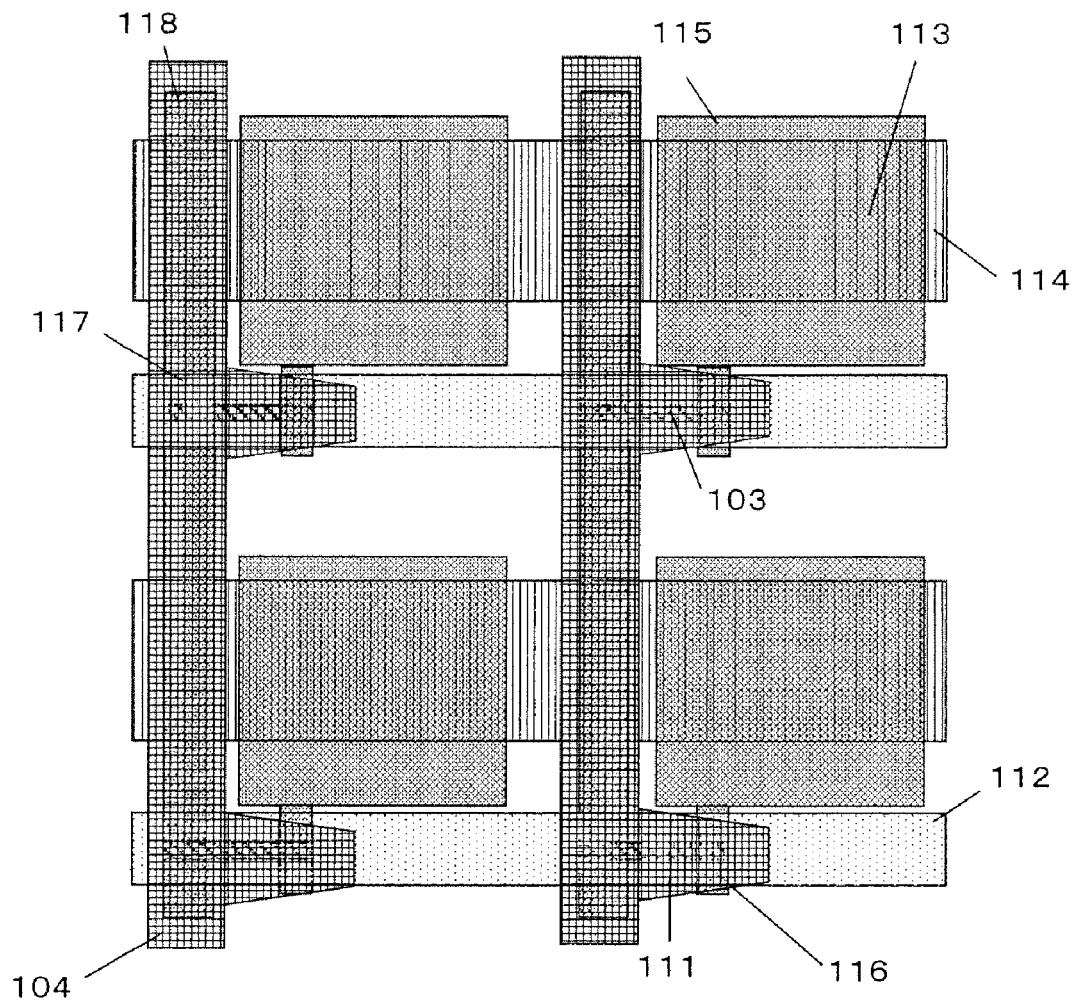
FIG. 25 is an exemplary diagram of a thin film transistor array (bottom gate/top contact type) of another embodiment of the present invention.

Here, a stripe-shaped pattern is necessary to be a line-shaped pattern which is not separated. However, a tripe-shaped pattern is not necessary to have an identical width at all parts. For example, patterns shown in FIGS. 24(*a*), (*b*) and (*c*) can be used. In addition, a stripe shaped sealing layer 104 is not limited to a sealing layer along a gate wire 112. A sealing layer can be along a source wire 118 shown in FIG. 25. Especially, in the case where a sealing layer 104 is formed as a stripe-shaped pattern on a large area by patterning by a liftoff method or an etching method, a thin film transistor array in which patterning is easy and yield is high can be obtained.

Figure 26:
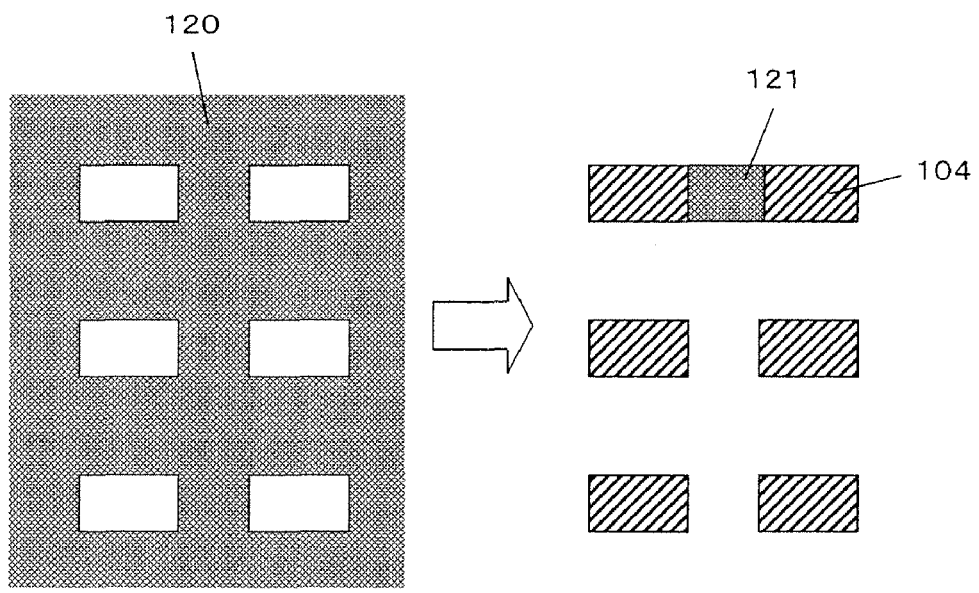
FIGS. 26(a) and (b) are explanatory diagrams showing a shape of a sealing layer pattern and the easiness of a liftoff.
Figure 26:
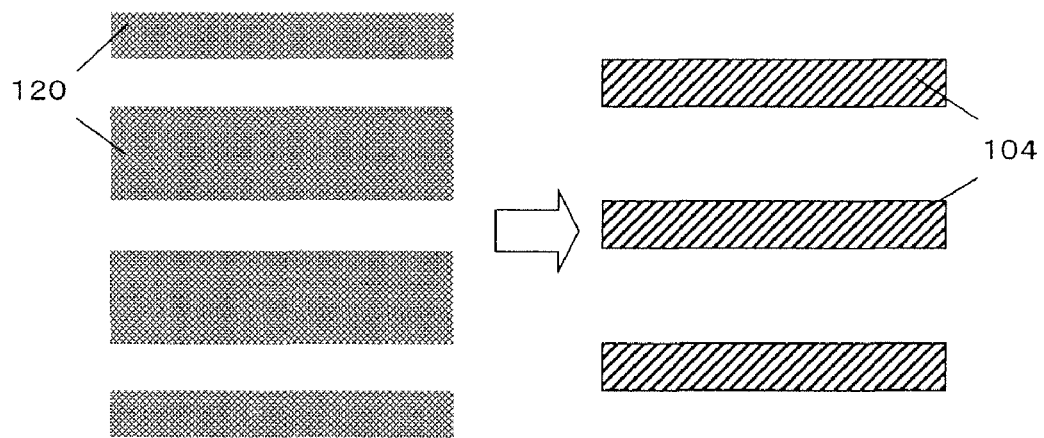

A shape of a sealing layer pattern and the easiness of a liftoff method are described referring to FIG. 26. As shown in FIG. 26(*a*), a sealing layer 104 is conventionally formed as an isolated pattern comprised of a small dot. In such a case, since a pattern of resist 120 is a three-dimensional and grid-shaped pattern, even if part of a resist can be removed, other part of a resist (remaining resist 121) can not be removed because the other part of the resist is stuck. Thereby, yield is reduced. On the other hand, in the case of a stripe-shaped sealing layer 104 shown in FIG. 26(*b*), since a pattern of a resist is a two-dimensional and line-shaped pattern, if part of a resist is peeled off, other part of a resist can be easily peeled off because peeling off of the part of the resist causes peeling off of the other part of the resist. Thereby, yield is improved. In addition, in the case where patterning is performed by an etching method, it is difficult to control etching characteristics of an isolated pattern comprised of a small dot shown in FIG. 26(*a*). Thereby, yield is reduced. Therefore, a stripe-shaped pattern is preferable.

A width of a sealing layer 104 is not especially limited. If a sealing layer 104 covers sufficiently at least semiconductor layer 103, the sealing layer 104 can be used.

It is desirable that a material used for the sealing layer 104 be especially an inorganic insulating material in the case where the sealing layer 104 is in contact with a semiconductor having an inorganic oxide as a main component.

For example, inorganic materials such as silicon oxide, silicon nitride, silicon oxynitride (SiNxOy), aluminium oxide, tantalum oxide, yttria, hafnium oxide, hafnium aluminates, zirconia oxide and titanium oxide can be used, but usable materials are not limited to these materials.

The sealing layer 104 may be used as monolayer, and the sealing layer 104 including a plurality of layers may be used.

For example, a glass or plastic substrate can be used for the insulating substrate 101.

Polymethyl methacrylate, acrylics, polycarbonate, polystyrene, polyethylen sulfide, polyethersulfone, polyolefin, polyethylene terephthalate, polyethylenenaphthalate, cycloolefin polymers, polyether sulfone, triacetylcellulose, polyvinyl fluoride film, ethylene-tetrafluoroethylene copolymer resin, weatherable polyethylene terephthalate, weatherable polypropylene, glass fiber-reinforced acryl resin film, glass fiber-reinforced polycarbonate, transparent polyimide, fluorinated resin and cyclic polyolefin resin can be used for a plastic substrate.

A substrate comprising only one material among above mentioned materials can be used, but a composite substrate comprising two or more materials among above mentioned materials can be used.

In addition, in the case where the substrate is an organic material film, a gas barrier film is preferably formed thereon in order to improve endurance as a device.

$Al_2O_3$, $SiO_2$, SiN, SiON, SiC, diamondlike carbon (DLC) or the like can be used for the gas barrier layer. In addition, the gas barrier layer may comprise two or more layers. In addition, the gas barrier layer may be formed only on one side of an organic material film substrate, and it may be formed on both sides.

The gas barrier layer can be formed by evaporation method, ion plating method, sputter method, laser ablation method, plasma CVD (Chemical Vapor Deposition) method, hot wire CVD method and sol-gel process.

In addition, a base material in which a color filter is formed on a glass or plastic substrate can be used.

A material used for an electrode material is not especially limited. However, oxide materials such as indium oxide ($In_2O_3$), tin oxide ($SnO_2$), zinc oxide (ZnO), cadmium oxide (CdO), cadmium indium oxide ($CdIn_2O_4$), cadmium tin oxide ($Cd_2SnO_4$), zinc tin oxide ($Zn_2SnO_4$) and indium zinc oxide (In—Zn—O) can be preferably used. In addition, these materials doped with imprity are preferably used in order to increase the electrical conductivity.

For example, indium oxide doped with tin (Sn), molybdenum (Mo) or titanium (Ti), tin oxide doped with antimony (Sb) or fluorine (F), zinc oxide doped with indium, aluminium and gallium (Ga) can be used. Among these doped materials, indium tin oxide (common name ITO) which is an indium oxide doped with tin (Sn) is preferably used, because ITO has a low electrical resistivity. In addition, a low resistance metal material such as Au, Ag, Cu, Cr, Al, Mg and Li can be preferably used.

In addition, an electrode having a plurality of layers including a conductive oxide material and a low resistance metal material can be used. In this case, in order to prevent oxidation and time degradation of metallic material, a three-layer structure, that is, conductive oxide thin film/metallic thin film/conductive oxide thin film, is preferably used. In addition, organic conducting materials such as PEDOT (polyethylen dihydroxy thiophen) can be preferably used. As for a gate electrode, a source electrode and a drain electrode, materials of them may be identical or all of the materials may be different from each other. However, in order to reduce the number of the processes, it is preferable that materials of a pixel electrode 115, a drain electrode 116, a source electrode 117 and a source wire 118 are identical.

These electrodes can be formed by vacuum evaporation method, ion plating method, sputter method, laser ablation method, plasma CVD technique, photo-CVD, hot wire CVD method, screen printing, relief printing and ink jet method. However, a usable method is not limited to these.

As a material used for gate insulating film 102, inorganic materials such as silicon oxide, silicon nitride, silicon oxy nitride, aluminium oxide, tantalum oxide, yttria, hafnium oxide, hafnium aluminates, oxidation zirconia, titanium oxide or polyacrylates such as PMMA (polymethyl methacrylate), PVA (polyvinyl alcohol), PS (polystyrene), transparent polyimide, polyester, epoxy, poly vinylphenol and polyvinyl alcohol can be used. However, a usable material is not limited to these.

In order to control a gate leak current, electrical resistivity of insulating materials should be equal to or more than $10^{11}$ $\Omega$cm, and more preferably it should be equal to or more than $10^{14}$ $\Omega$cm. The gate insulating film 102 can be formed by vacuum evaporation method, ion plating method, sputter method, laser ablation method, plasma CVD technique, photo-CVD, hot wire CVD method, spin coat, dip coat screen printing or the like.

A gate insulating layer 102 in which a composition may slope toward growth direction of the film is preferably used.

A semiconductor layer 103 used in the present invention is an inorganic oxide including one or more element among zinc, indium, tin, tungsten, magnesium and gallium. That is, well-known materials such as zinc oxide, indium oxide, indium zinc oxide, tin oxide, tungsten oxide and zinc gallium indium oxide (In—Ga—Zn—O) can be used. However the usable materials are not limited to these. Structure of these materials may be monocrystal, polycrystal, crystallite, mixed crystal of crystal/amorphous, nanocrystal scattering amorphous or amorphous. As for the film thickness of the semiconductor layer, it is preferable to be equal to or more than 10 nm.

A semiconductor layer including an oxide as a main component can be formed by sputter method, pulsed laser deposition, vacuum evaporation method, CVD method and sol-gel process, however sputter method, pulsed laser deposition, vacuum evaporation method and CVD method are preferably used. For sputter method, RF magnetron sputtering technique and DC sputter method can be used, for vacuum deposition, heating evaporation, electron beam evaporation and ion plating method can be used, and for CVD method, hot wire CVD method and plasma CVD technique can be used, but usable methods are not limited to these methods.

In an embodiment of the present invention, an image display medium of a display is not especially limited. However, an electrophoretic type, a liquid crystal type and an organic electroluminescence type can be used.

A structure of a transistor in an embodiment of the present invention is not especially limited. However, the present invention is effective especially in the case of a bottom gate type structure.

In addition, an interlayer dielectric, an upper pixel electrode, a gas barrier layer, a planarizing layer or the like can be used for a thin film transistor array of the present invention, if necessary.

As described above, in the present invention, the forming of a stripe-shaped sealing layer can allow alignment accuracy to be improved. Thereby, a thin film transistor array can be obtained in which characteristic degradation of a semiconductor is inhibited.

In addition, when a sealing layer is formed as a stripe-shaped pattern by a printing method, a sealing layer pattern can be easily formed. Therefore, a thin film transistor array can be manufactured in which alignment accuracy is good and yield is high.

Further, when a printing method is a screen printing method, a thin film transistor array can be manufactured in which an ink having various viscosities can be applied, an ink material can be selected from various materials, an efficiency in using an ink is high, and making a large area element is possible.

Further, when a printing method is a flexo printing, a thin film transistor array can be manufactured in which making a large area element is possible.

In addition, when a sealing layer is a stripe-shaped pattern, a thin film transistor array can be provided in which patterning by a liftoff method or an etching method can be easily performed and yield is high.

Further, since characteristics of a semiconductor are stabilized, an active matrix display can be obtained in which a high quality image can be displayed.

Hereinafter, the present invention is described based on examples.

EXAMPLES

Example 1

A method for manufacturing a bottom gate/bottom contact type thin film transistor array shown in FIG. 1, FIG. 2 (an enlarged view) and FIG. 3 (a cross-sectional diagram) is described. In this transistor array, size of one pixel was 500·m·500·m and the number of pixels was 240·320. In addition, a width of a stripe of a sealing layer was 200·m.

A polyethylenenaphthalate (PEN) film (a product made in Teijin Du Pont) was used for a substrate 1. A nanosilver ink (Nanosilver made in Sumitomo Electric Industries: Polyethylene glycol #200 made by Aldrich=8:1 (ratio in weight)) was printed on the PEN substrate by a reverse type offset printing method. After having baked the substrate at 180° C. for 1 hour, a gate electrode 11, a gate wire 12, a capacitor electrode 13 and a capacitor wire 14 were obtained.

Polyimide (Neopulim made in Mitsubishi Gas Chemical) was applied to the substrate by a die coater. Thereafter, a gate insulating film 2 was formed by drying the substrate at 180° C. for 1 hour. A nanosilver ink (Nanosilver made in Sumitomo Electric Industries: Polyethylene glycol #200 made by Aldrich=8:1 (ratio in weight)) as materials of a source electrode, a drain electrode, a source wire and a pixel electrode is printed over the PEN substrate by a reverse type offset printing method. After having dried the substrate, a source electrode 17, a drain electrode 16, a source wire 18 and a pixel electrode 15 were formed.

A semiconductor layer was formed by the following processes: a solution in which Liscon SP200 (a product made in Merck) was dissolved in tetralin (a product made in KANTO KAGAKU) was used as a semiconductor material. A stripe-shaped semiconductor layer 3 was formed by applying the semiconductor material by a dispenser method. The semiconductor layer 3 was formed by drying the semiconductor material at 100° C. for 90 minutes.

A sealing layer 4 was formed by the following processes: a fluorine system resin (CYTOP: a product of ASAHI GLASS) was used as a sealing material. The sealing material was printed as a stripe-shaped pattern by a screen printing. The sealing layer 4 was formed by drying the sealing material in vacuum at 90° C. for 2 hours.

The printing was continuously possible while the alignment accuracy was good. Next, an electrophoretic type image display medium was sandwiched between the substrate and a counter electrode. When the image display medium between them was driven, display was good.

Example 2

A method for manufacturing a bottom gate/bottom contact type thin film transistor array shown in FIG. 1, FIG. 2 (an enlarged view) and FIG. 3 (a cross-sectional diagram) the same as Example 1 is described. Elements to a semiconductor layer were formed by the same method as Example 1. A sealing layer 4 was formed by the following processes: a fluorine system resin (CYTOP: a product of ASAHI GLASS) was used as a sealing material. The sealing material was printed as a stripe-shaped pattern by a flexo printing. The sealing layer 4 was formed by drying the sealing material in vacuum at 90° C. for 2 hours.

The printing was possible while the alignment accuracy was good. Next, an electrophoretic type image display medium was sandwiched between the substrate and a counter electrode. When the image display medium between them was driven, display was good.

Example 3

Figure 6:
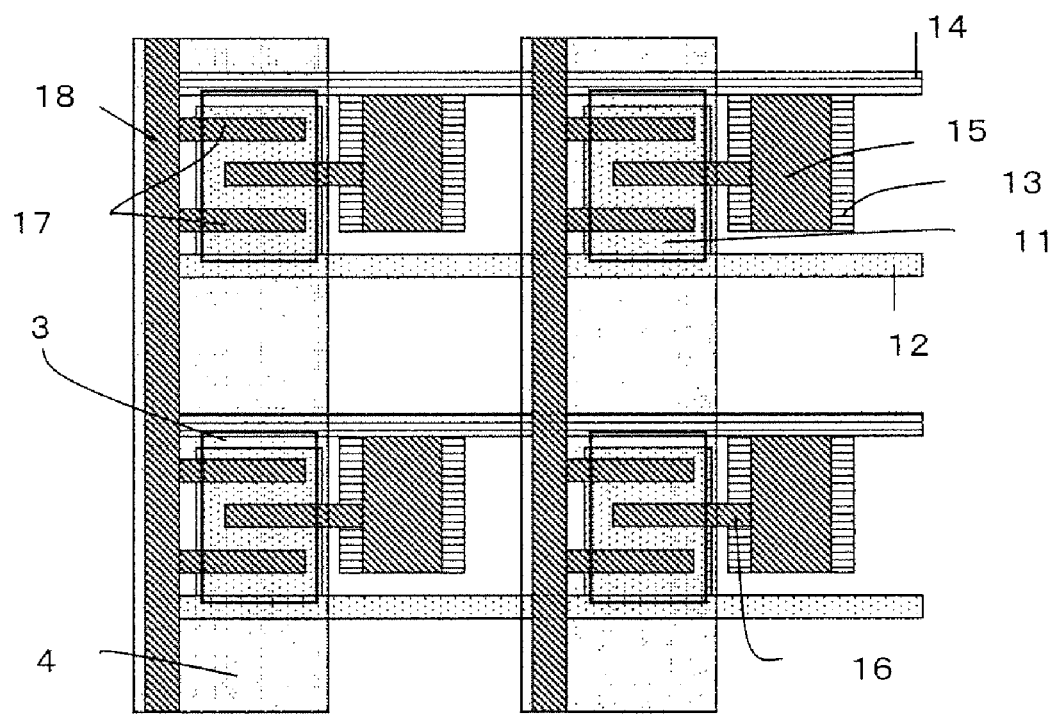
FIG. 6 is an exemplary diagram of a thin film transistor array (bottom gate/bottom contact type) of another embodiment of the present invention.
Figure 7:
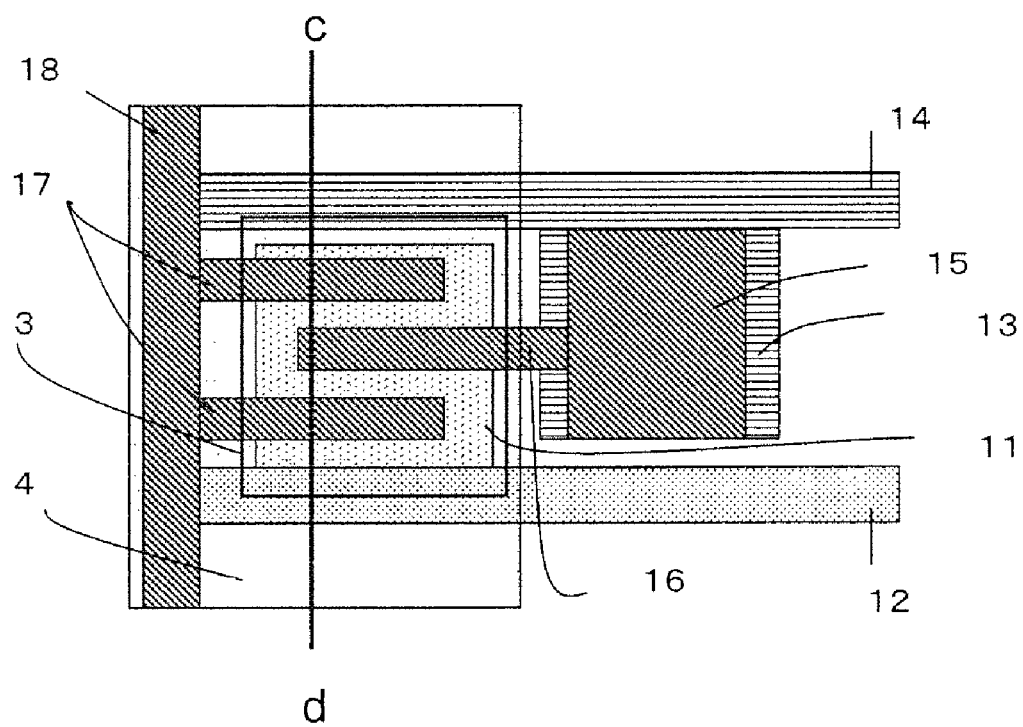
FIG. 7 is an enlarged view of one pixel in FIG. 6.
Figure 8:
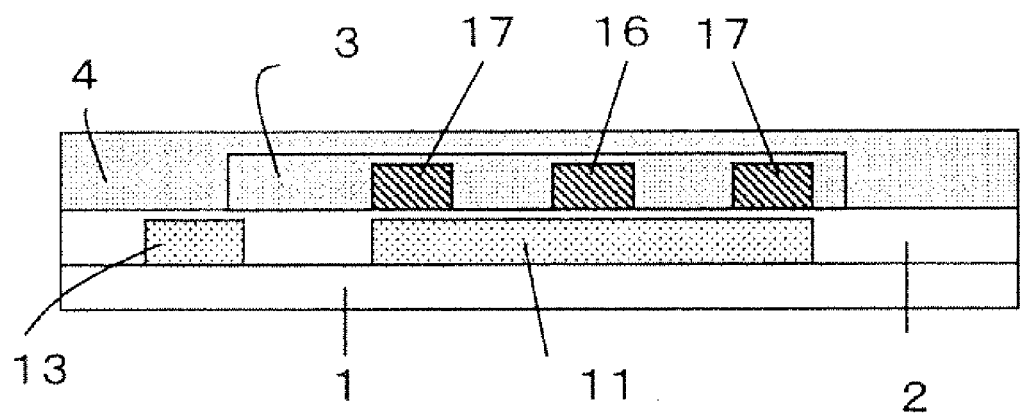
FIG. 8 is a cross-sectional view taken along the line c-d in FIG. 7.

A method for manufacturing a bottom gate/bottom contact type thin film transistor array shown in FIG. 6, FIG. 7 (an enlarged view) and FIG. 8 (a cross-sectional diagram) is described. A stripe width of a sealing layer was 250·m.

Elements to a semiconductor layer were formed by the same method as Example 1.

A sealing layer 4 was formed by the following processes: a fluorine system resin (CYTOP: a product of ASAHI GLASS) was used as a sealing material. The sealing material was printed as a stripe-shaped pattern covering a source wire 18 by a flexo printing. The sealing layer 4 was formed by drying the sealing material in vacuum at 90° C. for 2 hours. The printing was possible while the alignment accuracy was good. Next, an electrophoretic type image display medium was sandwiched between the substrate and a counter electrode. When the image display medium between them was driven, display was good.

Example 4

Figure 9:
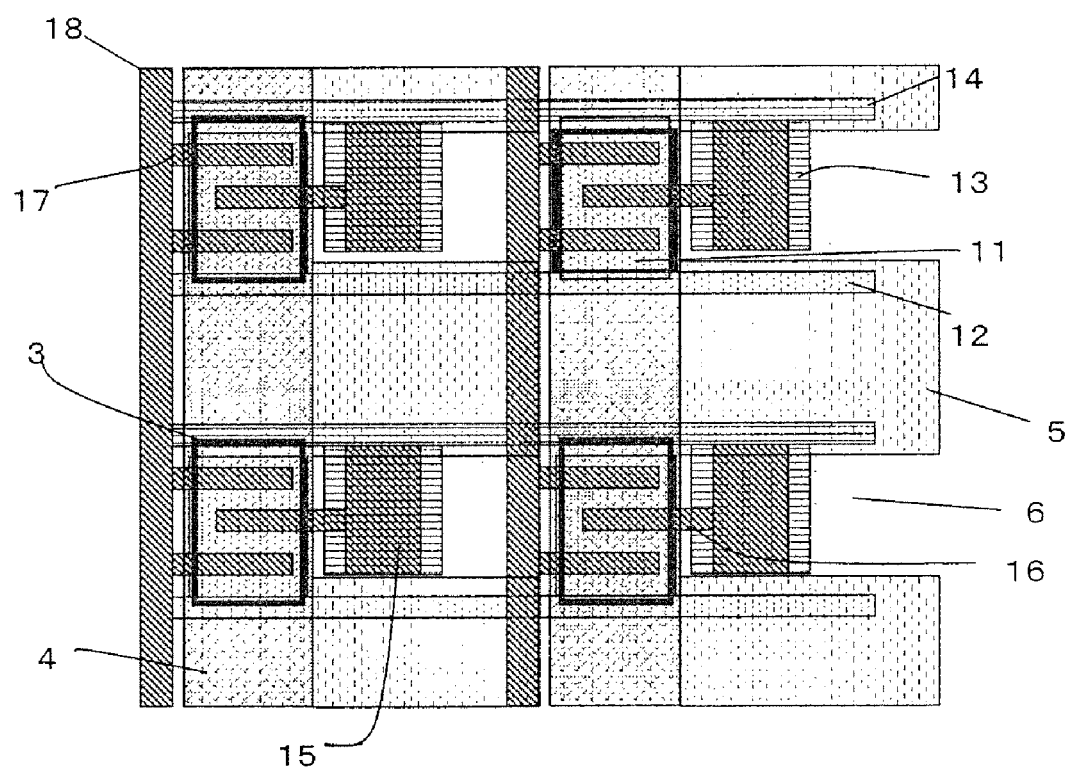
FIG. 9 is an exemplary diagram of a thin film transistor array (bottom gate/bottom contact type) of another embodiment of the present invention.
Figure 10:
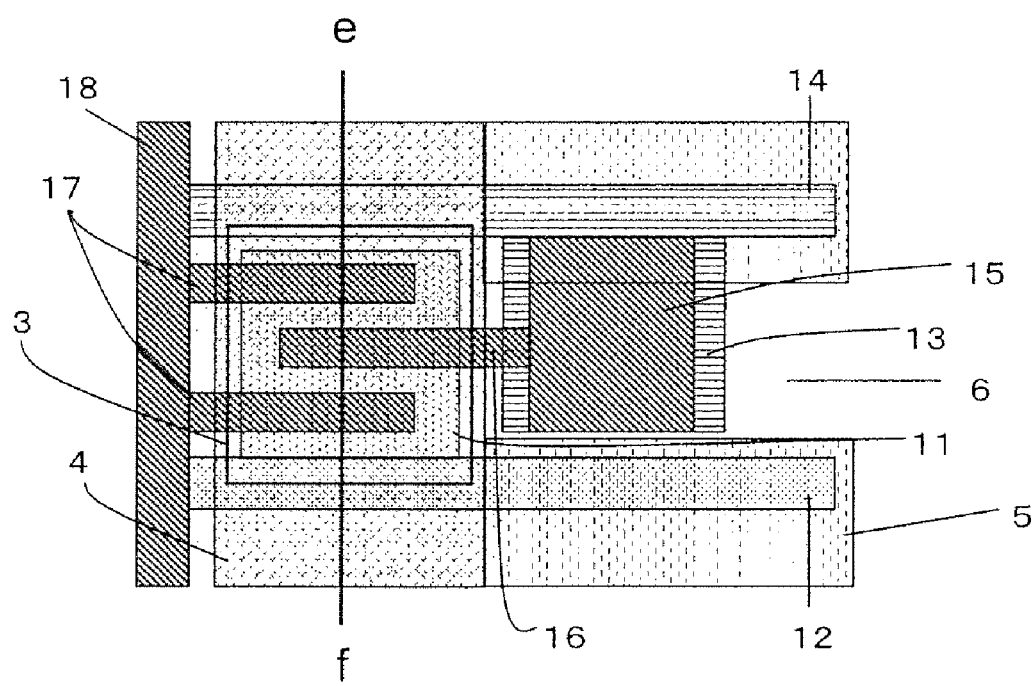
FIG. 10 is an enlarged view of one pixel in FIG. 9.
Figure 11:
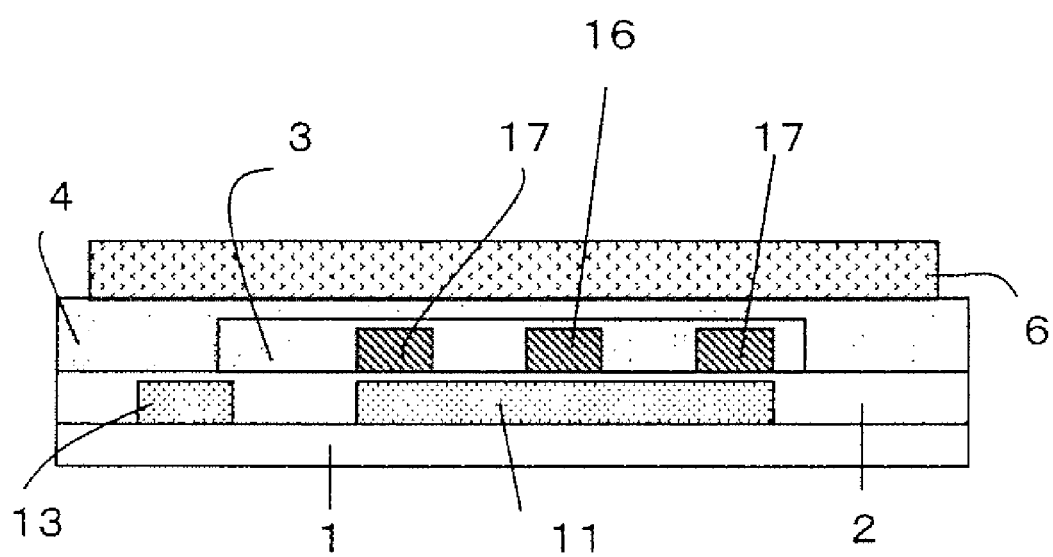
FIG. 11 is a cross-sectional view taken along the line e-f in FIG. 10.

A method for manufacturing a bottom gate/bottom contact type thin film transistor array shown in FIG. 9, FIG. 10 (an enlarged view) and FIG. 11 (a cross-sectional diagram) is described. In this transistor array, size of one pixel was 500·m·500·m and the number of pixels was 240·320. In addition, a width of a stripe of a sealing layer was 200·m.

Elements to a semiconductor layer were formed by the same method as Example 1. A sealing layer 4 was formed by the following processes: a fluorine system resin (CYTOP: a product of ASAHI GLASS) was used as a sealing material. The sealing material was printed as a stripe-shaped pattern by a screen printing. The sealing layer 4 was formed by drying the sealing material in vacuum at 90° C. for 2 hours. Forming the sealing layer was possible while the alignment accuracy was good.

An epoxy resin (a product of Ajinomoto-Fine-Techno Co., Inc.) was used as an interlayer dielectric material. The material was printed as a dot-shaped pattern on the substrate by a screen printing. An interlayer dielectric 5 was formed by drying the material at 90° C. for 1 hour. A silver paste (a product of Ajinomoto-Fine-Techno Co., Inc.) was used as an upper pixel electrode material. The material was printed on the substrate by a screen printing. An upper pixel electrode 6 was formed by drying the material at 90° C. for 1 hour.

Thereafter, when a display made by sandwiching electrophoretic medium between this substrate and a counter electrode was driven, a good image could be displayed. The contrast was further improved compared with Example 3.

Example 5

Figure 12:
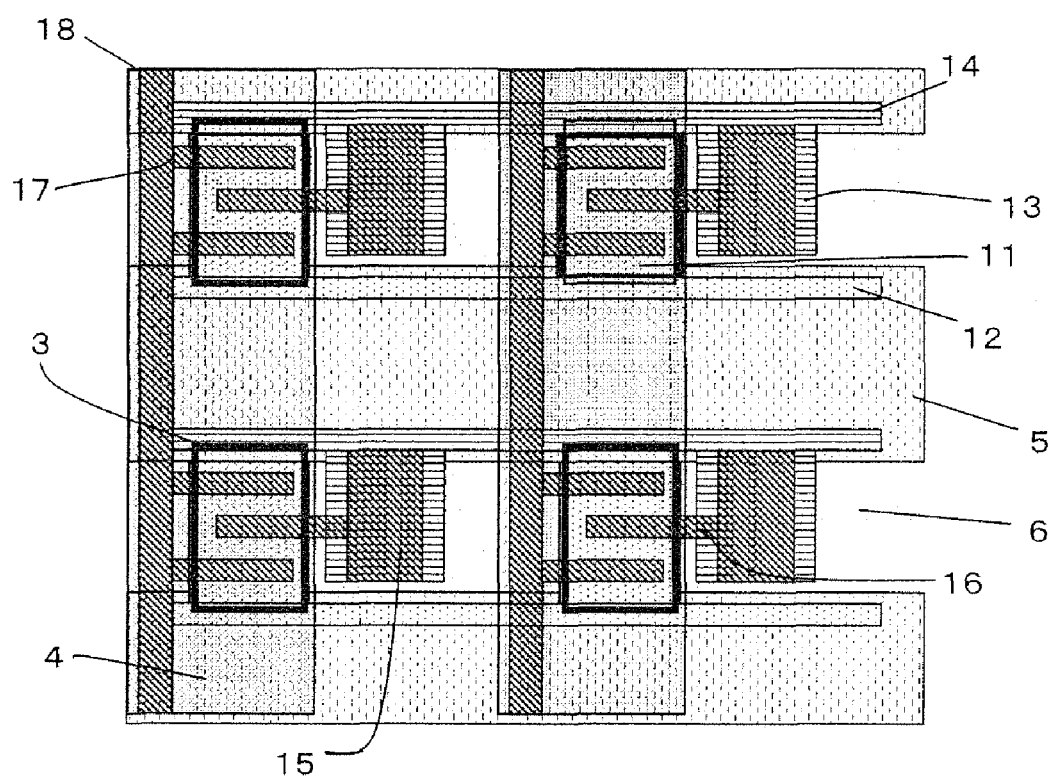
FIG. 12 is an exemplary diagram of a thin film transistor array (bottom gate/bottom contact type) of another embodiment of the present invention.
Figure 14:
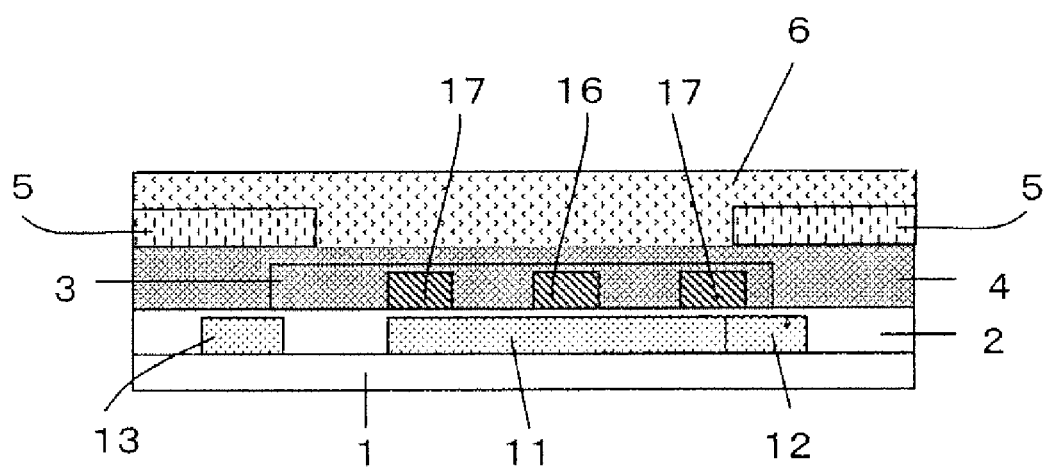
FIG. 14 is a cross-sectional view taken along the line g-h in FIG. 13.
Figure 15:
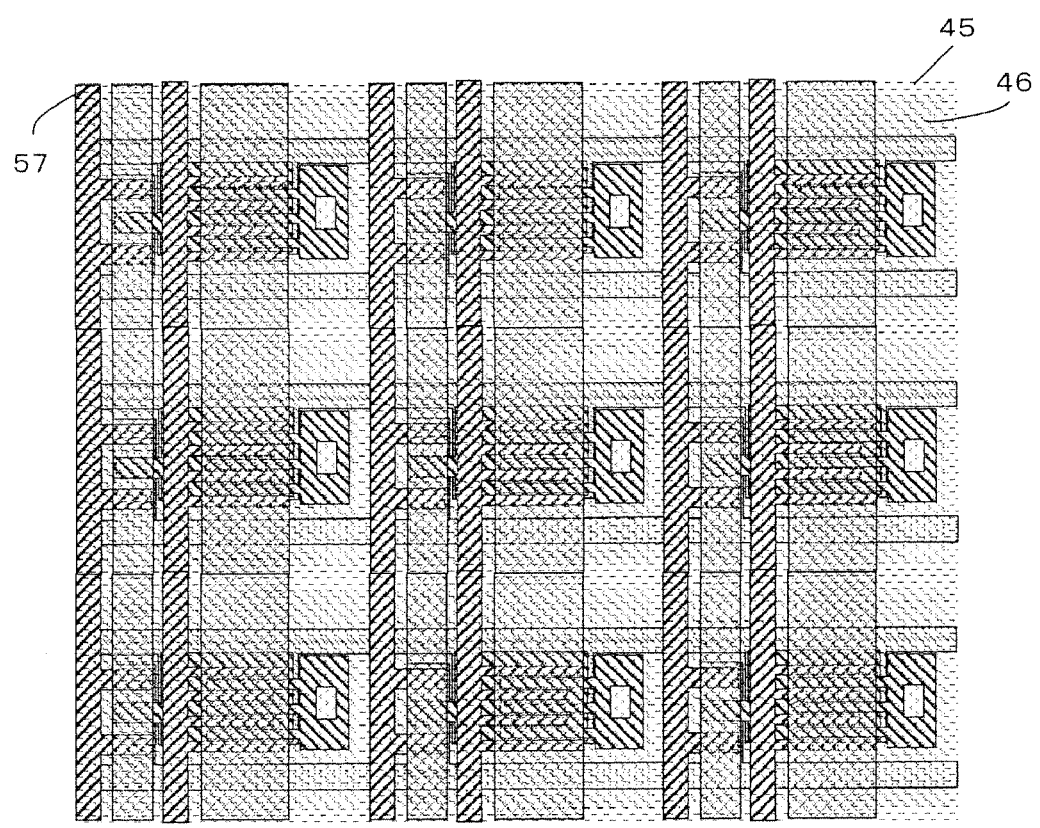
FIG. 15 is an exemplary diagram of an organic EL using a thin film transistor array (bottom gate/bottom contact type) of another embodiment of the present invention.
Figure 16:
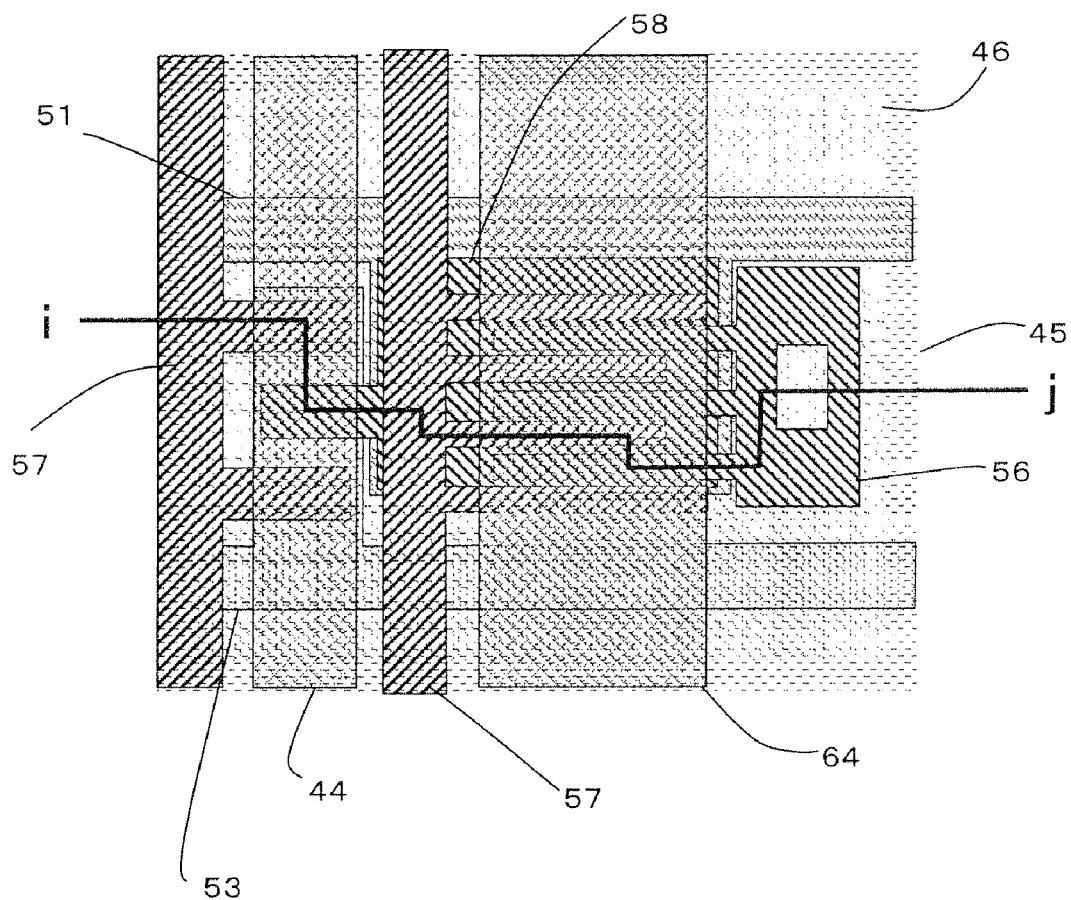
FIG. 16 is an enlarged view of one pixel in FIG. 15.
Figure 17:
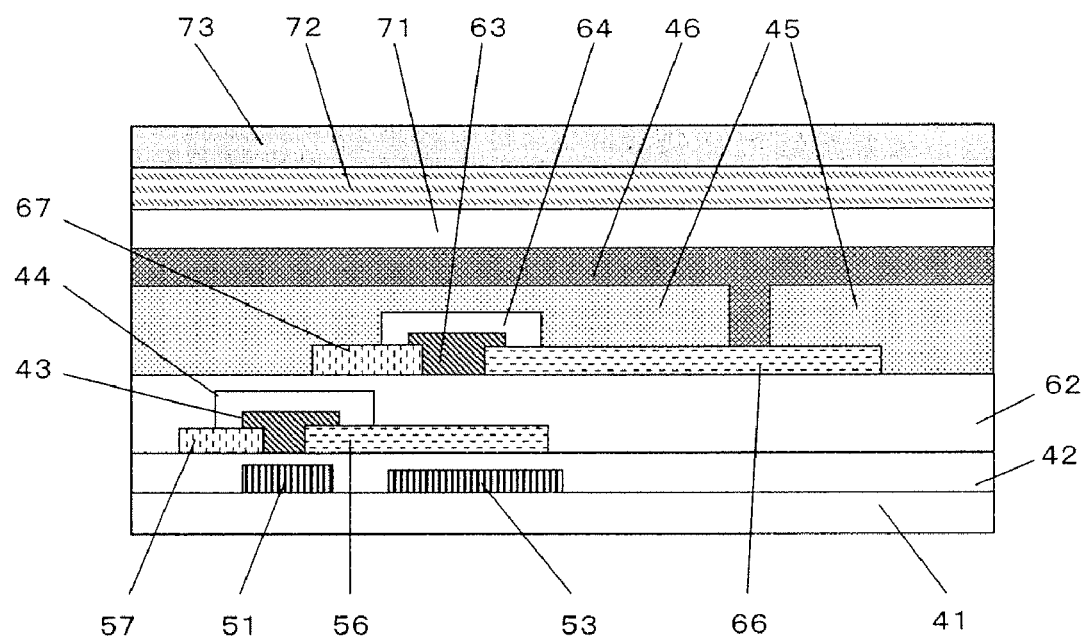
FIG. 17 is a cross-sectional view taken along the line i-j in FIG. 16.
Figure 18:
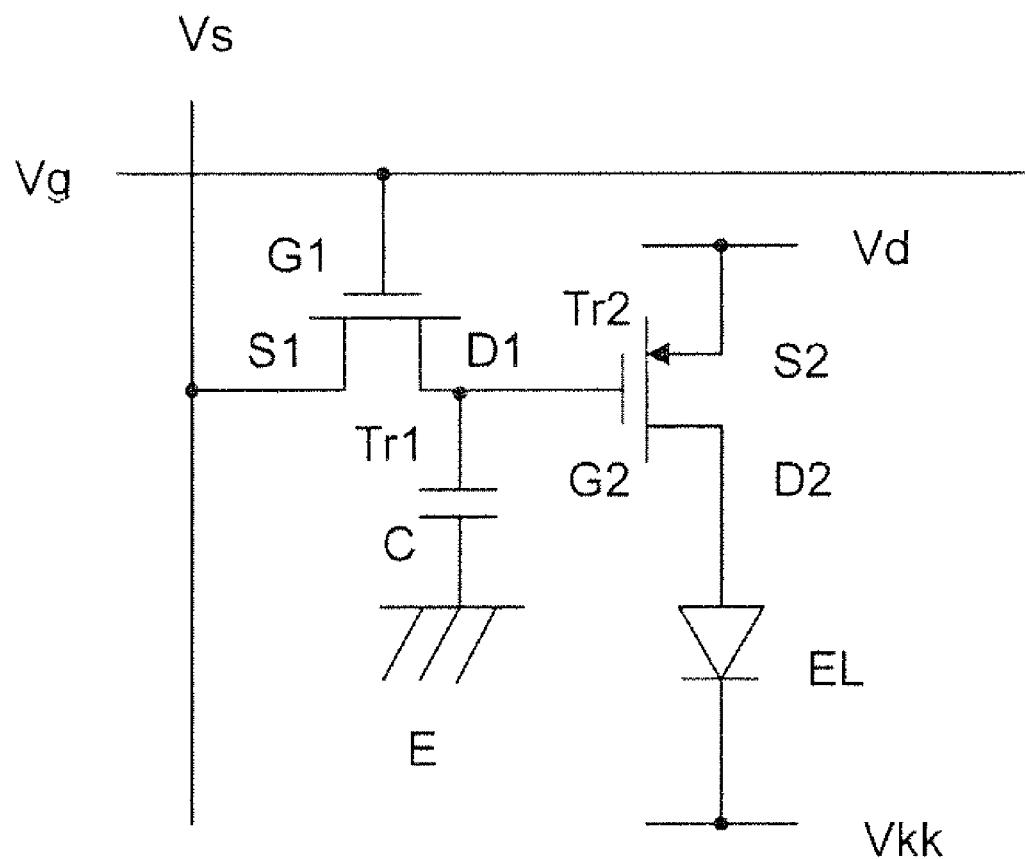
FIG. 18 is a circuit diagram in FIG. 16.

A method for manufacturing a bottom gate/bottom contact type thin film transistor array shown in FIG. 12, FIG. 13 (an enlarged view) and FIG. 14 (a cross-sectional diagram) is described. In this transistor array, size of one pixel was 500 µm×500 µm and the number of pixels was 240×320. In addition, a width of a stripe of a sealing layer was 250 µm.

A polyethylenenaphthalate (PEN) film (a product made in Teijin Du Pont) was used for a substrate 1. A nanosilver ink (Nanosilver made in Sumitomo Electric Industries: Polyethylene glycol #200 made by Aldrich=8:1 (ratio in weight)) was printed on the PEN substrate by a reverse type offset printing method. After having baked the substrate at 180° C. for 1 hour, a gate electrode 11, a gate wire 12, a capacitor electrode 13 and a capacitor wire 14 were obtained.

Polyvinyl phenol (a product of Aldrich) was applied to the substrate by a die coater as a gate insulating film. The gate insulating film 2 was formed by drying the polyvinyl phenol at 180° C. for 1 hour. A nanosilver ink (Nanosilver made in Sumitomo Electric Industries: Polyethylene glycol #200 made by Aldrich=8:1 (ratio in weight)) was used as a source electrode, drain electrode, a source wire and a pixel electrode. The nanosilver ink was printed on the substrate by reverse type offset printing. A source electrode 17 and a drain electrode 16, a source wire 18 and a pixel electrode 15 were formed by drying the ink at 180° C. for 1 hour.

A semiconductor layer 3 was formed by the following processes: a solution in which Liscon SP200 (a product made in Merck) was dissolved in tetralin (a product made in KANTO KAGAKU) was used as a semiconductor material; a semiconductor layer 3 was formed by using a dispenser; and the semiconductor layer 3 was formed by drying the semiconductor at 100° C. for 90 minutes.

A sealing layer 4 was formed by the following processes: a fluorine system resin (CYTOP: a product of ASAHI GLASS) was used as a sealing material. The sealing material was printed as a stripe-shaped pattern by a screen printing. The sealing layer 4 was formed by drying the sealing material in vacuum at 90° C. for 2 hours.

Next, a fluorine system resin (CYTOP: a product of ASAHI GLASS) was used for an interlayer dielectric. The interlayer dielectric material was printed as a stripe-shaped pattern by a screen printing. The interlayer dielectric layer 5 was formed by drying the interlayer dielectric material in vacuum at 90° C. for 2 hours.

A silver paste (a product of Ajinomoto-Fine-Techno Co., Inc.) was used as an upper pixel electrode material. The material was printed on the substrate by a screen printing. An upper pixel electrode 29 was formed by drying the material at 90° C. for 1 hour.

Thereafter, when a display made by sandwiching an electrophoretic medium between this substrate and a counter electrode was driven, a good image could be displayed. The contrast was further improved compared with Example 1.

Example 6

Example 6 is described below. As shown in FIGS. 15, 16, 17 and 18, alkali free glass 1737 (0.7 mm thickness; a product of Corning Incorporated) was used as a glass substrate 41. Gate electrode (G1) 51 and capacitor electrode (C) 53 were formed by the following processes: ITO was deposited by a sputtering method; and patterning of ITO was performed by applying a photo resist, exposure, development, etching and peeling of the resist.

As gate insulating film (GI1) 42, polyvinyl phenol (a product of Aldrich) was applied to the substrate by ink jet method. Gate insulating film (GI1) 42 was formed by drying it at 180° C. for 1 hour.

For source electrode (S1) 57 and drain electrode (D1) 56 which was also gate electrode (G2), ITO was deposited by a sputtering method. Patterning of ITO was performed by applying a photo resist, exposure, development, etching and peeling of the resist.

A semiconductor layer 43 was formed by the following processes: a solution in which Fluorene BT [2,2'-bithiophene] copolymer (F8T2) was dissolved in tetralin (a product made in KANTO KAGAKU) so that Fluorene BT [2,2'-bithiophene]copolymer (F8T2) was 1.0 weight % was used as a semiconductor material. A photosensitive resin relief plate was used as a relief printing plate. An anilox roll with 150 lines was used. A stripe-shaped semiconductor was formed by printing the semiconductor material by a relief printing. Organic semiconductor layer (OSC1) 43 was formed by drying the semiconductor material at 100° C. for 60 minutes.

A sealing layer (F1) 44 was formed by the following processes: a fluorine system resin (CYTOP: a product of ASAHI GLASS) was used as a sealing material. The sealing material was printed as a stripe-shaped pattern by a screen printing. The sealing layer (F1) was formed by drying the sealing material in vacuum at 90° C. for 2 hours.

Again, as gate insulating film (GI2), polyvinyl phenol (a product of Aldrich) was applied to the substrate by ink jet method. Gate insulating film (GI2) 62 was formed by drying it at 180° C. for 1 hour.

For source electrode (S2) 67 and drain electrode (D2) 66, ITO was deposited by a sputtering method. Patterning of ITO was performed by applying a photo resist, exposure, development, etching and peeling of the resist.

Again, a semiconductor layer was formed by the following processes: a solution in which Fluorene BT [2,2'-bithiophene]copolymer (F8T2) was dissolved in tetralin (a product made by KANTO KAGAKU) so that Fluorene BT [2,2'-bithiophene]copolymer (F8T2) was 1.0 weight % was used as a semiconductor material. A photosensitive resin relief plate was used as a relief printing plate. An anilox roll with 150 lines was used. A stripe-shaped semiconductor was formed by printing the semiconductor material by a relief printing. Semiconductor layer (OSC2) 63 was formed by drying the semiconductor material at 100° C. for 60 minutes.

Again a sealing layer (F2) 64 was formed by the following processes: a fluorine system resin (CYTOP: a product of ASAHI GLASS) was used as a sealing material. The sealing material was printed as a stripe-shaped pattern by a screen printing. The sealing layer (F2) 64 was formed by drying the sealing material in vacuum at 90° C. for 2 hours.

As a material of an interlayer dielectric, a photosensitive transparent acryl resin was used. Exposure and development were performed. Interlayer dielectric 45 was formed by baking it at 180° C. for 30 minutes.

As a material of an upper pixel electrode, ITO was deposited by a sputtering method. Patterning of ITO was conducted by applying a photo resist, exposure, development, etching and peeling of the resist.

Thereafter, as hole transport layer 71, poly (ethylenedioxy thiophen)/polystyrene sulfonate (PEDOT/PSS) was applied to the entire surface by a spin coating. Poly (ethylenedioxy thiophen)/polystyrene sulfonate (PEDOT/PSS) was dried at 100° C. for 1 hour.

Next, light emitting layers 72 of a red light emitting layer, a green light emitting layer and a blue light emitting layer, these layers including poly fluorene system substance, was sequentially formed by a relief printing method.

Further each of calcium 10 nm and silver 300 nm was formed into a film on the whole surface as a common electrode 73 by vacuum evaporation deposition. Finally, the whole was covered with a seal glass. When this color organic EL display was drive, display was good.

Example 7

Figure 19:
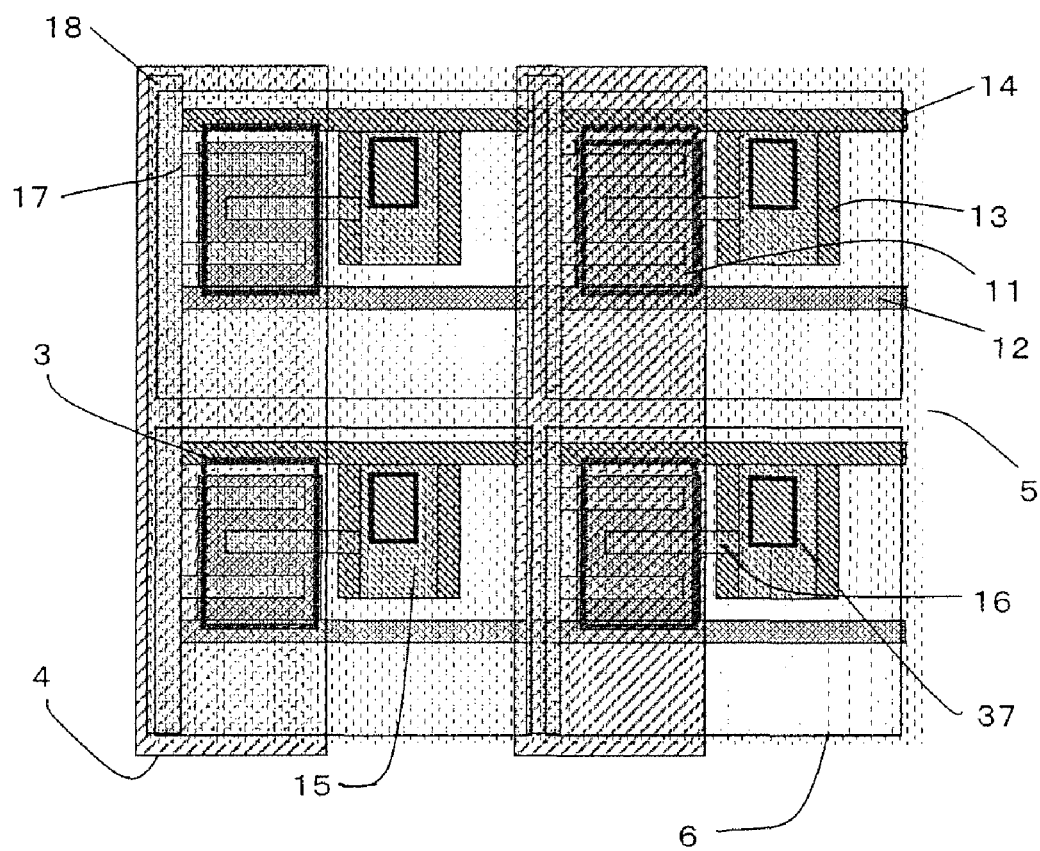
FIG. 19 is an exemplary diagram of a thin film transistor array (bottom gate/bottom contact type) of another embodiment of the present invention.

Manufacturing was performed by the same way as Example 4 except that an interlayer dielectric having an opening, the interlayer dielectric being not a dot-shaped pattern and a stripe-shaped pattern, was formed on a pixel electrode shown in FIG. 19 by a screen printing method. An opening on a pixel electrode could not partially formed.

Next, an electrophoretic type image display medium was sandwiched between the substrate and a counter electrode. When the medium was driven, a pixel electrode was not electrically connected to an upper pixel electrode at part where an opening on a pixel electrode was not able to be formed. Thereby, display was not good. However, there was not a significant influence on the entire display.

Example 8

A method for manufacturing a bottom gate/top contact type thin film transistor array shown in FIG. 20, FIG. 21 and FIG. 22 is described. In this transistor array, size of one pixel was 125 μm×125 μm and the number of pixels was 480×640. In addition, a width of a stripe of a sealing layer was 35 μm. A polyethylenenaphthalate (PEN) film (a product made in Teijin Du Pont) was used for an insulating substrate 1. ITO was deposited to 100 nm by a DC magnetron sputtering apparatus, thereafter a gate electrode 111, a gate wire 112, a capacitor electrode 113 and a capacitor wire 114 was formed by a photolithography method.

Next, the following layers were continuously formed by a RF magnetron sputtering method: a gate insulating layer 102 (film thickness: 300 nm) comprised of SiON; and a semiconductor layer 103 (film thickness: 35 nm) comprised of an In—Ga—Zn—O system oxide. Table 1 shows a condition in film formation by a sputtering method.

TABLE 1

|  | target | Flow rate of Ar [SCCM] | Flow rate of $O_2$ [SCCM] | operating pressure [Pa] | Input power [W] |
| --- | --- | --- | --- | --- | --- |
| gate electrode 111 gate wire 112 capacitor electrode 113 capacitor wire 114 | $SnO_2$: 10 wt. % - $In_2O_3$ | 10 | 0.3 | 0.5 | 200 |
| gate insulating film 102 | $Si_3N_4$ | 40 | 2 | 0.5 | 500 |
| Semiconductor layer 103 | $InGaZnO_4$ | 10 | 0.3 | 0.5 | 200 |
| Pixel electrode 115 Drain electrode 116 Source electrode 117 Source wire 118 | $SnO_2$: 10 wt. % - $In_2O_3$ | 10 | 0.3 | 0.5 | 200 |
| Sealing layer 104 | $Si_3N_4$ | 40 | 4 | 0.5 | 500 |

Further, a resist was applied, and drying and development were performed. Thereafter, ITO film was deposited to 100 nm by a DC magnetron sputtering method. Further, after a liftoff was performed, a pixel electrode 115, a drain electrode 116, a source electrode 117 and a source wire 118 were formed. A resist was applied thereon, and drying and development were performed. Thereafter, SiON was deposited to 40 nm by RF magnetron sputtering method. Further, after a liftoff was performed, a stripe-shaped sealing layer 4 was formed. The resist was easily peeled off within a processing time of 3 minutes while there was not a remaining resist. Thereafter, when a display made by sandwiching an electrophoretic medium between this substrate and a counter electrode was driven, a good image could be displayed.

Comparative Example 1

Manufacturing was performed by the same way as Example 1 except that a sealing layer was formed not as a stripe-shaped pattern but as a dot-shaped pattern by a screen printing. When printing was repeated, clogging of a printing plate occurred while misalignment occurred.

When a display made by sandwiching an electrophoretic medium between this substrate and a counter electrode was driven, good display was not obtained when time passed, due to characteristic degradation of a semiconductor.

Comparative Example 2

Manufacturing was performed by the same way as Example 2 except that a sealing layer was formed not as a stripe-shaped pattern but as a dot-shaped pattern by a flexo printing. A misalignment in the dot-shaped sealing layer formed by the flexo printing occurred. That is, the sealing layer was not able to be formed desirably.

When a display made by sandwiching an electrophoretic medium between this substrate and a counter electrode was driven, good display was not obtained when time passed, due to characteristic degradation of a semiconductor.

Comparative Example 3

Manufacturing was performed by the same way as Example 8 except that a sealing layer is not a stripe-shaped pattern but a dot-shaped pattern. It took twice time for a liftoff processing compared with Example 7. In addition, a resist was not partially peeled off. When a display made by sandwiching an electrophoretic medium between this substrate and a counter electrode was driven, a display defect occurred.

What is claimed is:

1. A thin film transistor array, comprising:
an insulating substrate;
a plurality of thin film transistors, each of the thin film transistors comprising a source electrode, a drain electrode, a gate electrode and a semiconductor layer between the source electrode and the drain electrode; and
a plurality of sealing layers, each of the sealing layers being stripe-shaped, and each of the sealing layers covering the plurality of the thin film transistors and formed over the insulating substrate.

2. The thin film transistor array according to claim 1, wherein each of the sealing layers includes a fluorinated compound.

3. The thin film transistor array according to claim 1, wherein each of the sealing layers includes an inorganic insulating material.

4. The thin film transistor array according to claim 1, wherein each of the sealing layers includes silicon oxynitride.

5. A method for manufacturing the thin film transistor array according to claim 1,
the method comprising:
forming each of the sealing layers by a printing method.

6. The method for manufacturing the thin film transistor array according to claim 5,
wherein the printing method is a screen printing.

7. The method for manufacturing the thin film transistor array according to claim 5,
wherein the printing method is a flexo printing.

8. The method for manufacturing the thin film transistor array according to claim 5,
wherein at least one process among a process of forming a gate electrode, a process of forming a source electrode and a drain electrode and a process of forming a pixel electrode is performed by a screen printing, a flexo printing or a reverse type offset printing.

9. An active matrix display, comprising:
the thin film transistor array according to claim 1; and
an image display medium.

10. The active matrix display according to claim 9, wherein the image display medium is an electrophoretic type.

11. The active matrix display according to claim 9, wherein the image display medium is a liquid crystal type.

12. The active matrix display according to claim 9, wherein the image display medium is an organic electroluminescence type.

13. A thin film transistor array, comprising:
an insulating substrate;
a plurality of thin film transistors,
each of the thin film transistors, comprising:
a gate electrode on the insulating substrate;
a gate insulating layer;
a source electrode and a drain electrode, the gate electrode overlapping the source electrode and the drain electrode through the gate insulating layer;
a semiconductor layer between the source electrode and the drain electrode;
a pixel electrode connected to the drain electrode; and
a capacitor electrode, the pixel electrode overlapping the capacitor electrode through the gate insulating layer,
the thin film transistors arranged in a matrix-shaped and being with a plurality of gate wires connected to a plurality of the gate electrodes and a plurality of source wires connected to a plurality of the source electrodes; and
a plurality of sealing layers, each of the sealing layers formed over at least the semiconductor layer, each of the sealing layers being stripe-shaped over the insulating substrate and each of the sealing layers covering a plurality of the thin film transistors.

14. The thin film transistor array according to claim 13, wherein each of the sealing layers covers the source wires.

15. The thin film transistor array according to claim 13, wherein an interlayer dielectric covers part of the gate wires and a capacitor wire connected to the capacitor electrode,
and
wherein an upper pixel electrode connected to the pixel electrode is formed over the interlayer dielectric.

16. The thin film transistor array according to claim 15, wherein the interlayer dielectric is a dot-shaped type formed between the sealing layers or a stripe-shaped type perpendicular to each of the sealing layers, the stripe-shaped type covering a plurality of the thin film transistors.

17. The thin film transistor array according to claim 15, wherein the interlayer dielectric includes a fluorinated compound.

18. The thin film transistor array according to claim 13, wherein the semiconductor layer includes an organic compound.

19. The thin film transistor array according to claim 13, wherein the semiconductor layer includes an inorganic oxide.

* * * * *